(12) United States Patent
Liu

(10) Patent No.: US 11,763,885 B2
(45) Date of Patent: *Sep. 19, 2023

(54) VARIABLE RESISTANCE MEMORY WITH LATTICE ARRAY USING ENCLOSING TRANSISTORS

(71) Applicant: Ovonyx Memory Technology, LLC, Alexandria, VA (US)

(72) Inventor: Jun Liu, Boise, ID (US)

(73) Assignee: Ovonyx Memory Technology, LLC, Alexandria, VA (US)

( * ) Notice: Subject to any disclaimer, the term of this patent is extended or adjusted under 35 U.S.C. 154(b) by 38 days.

This patent is subject to a terminal disclaimer.

(21) Appl. No.: 17/348,194

(22) Filed: Jun. 15, 2021

(65) Prior Publication Data
US 2021/0312988 A1    Oct. 7, 2021

Related U.S. Application Data

(60) Division of application No. 16/776,383, filed on Jan. 29, 2020, now Pat. No. 11,062,771, which is a
(Continued)

(51) Int. Cl.
*G11C 13/00* (2006.01)
*G11C 5/06* (2006.01)
(Continued)

(52) U.S. Cl.
CPC ............ *G11C 13/0069* (2013.01); *G11C 5/06* (2013.01); *G11C 5/063* (2013.01);
(Continued)

(58) Field of Classification Search
None
See application file for complete search history.

(56) References Cited

U.S. PATENT DOCUMENTS

| 4,566,022 A | 1/1986 | Kalter et al. |
| 5,391,901 A * | 2/1995 | Tanabe ............. H01L 27/10805 257/773 |

(Continued)

FOREIGN PATENT DOCUMENTS

| TW | 552681 B | 9/2003 |
| TW | I247147 B | 1/2006 |

OTHER PUBLICATIONS

International Search Report and Written Opinion of the International Searching Authority, for PCT/US2008/058984, dated Oct. 23, 2008, (10 pgs.).

(Continued)

*Primary Examiner* — J. H. Hur
(74) *Attorney, Agent, or Firm* — Holland & Hart LLP

(57) ABSTRACT

A variable resistance memory array, programming a variable resistance memory element and methods of forming the array. A variable resistance memory array is formed with a plurality of word line transistors surrounding each phase change memory element. To program a selected variable resistance memory element, all of the bitlines are grounded or biased at the same voltage. A top electrode select line that is in contact with the selected variable resistance memory element is selected. The word line having the word line transistors surrounding the selected variable resistance memory element are turned on to supply programming current to the element. Current flows from the selected top electrode select line through the variable resistance memory element into the common source/drain region of the surrounding word line transistors, across the transistors to the nearest bitline contacts. The word lines are patterned in various lattice configurations.

19 Claims, 41 Drawing Sheets

Related U.S. Application Data division of application No. 16/153,143, filed on Oct. 5, 2018, now Pat. No. 10,573,384, which is a continuation of application No. 14/940,386, filed on Nov. 13, 2015, now Pat. No. 10,109,347, which is a continuation of application No. 13/776,354, filed on Feb. 25, 2013, now Pat. No. 9,209,395, which is a division of application No. 12/888,201, filed on Sep. 22, 2010, now Pat. No. 8,385,112, which is a division of application No. 11/730,719, filed on Apr. 3, 2007, now Pat. No. 7,817,454.

(51) Int. Cl.
　　　G11C 11/4097　　(2006.01)
　　　H10B 63/00　　　(2023.01)
　　　H10N 70/00　　　(2023.01)
　　　H10N 70/20　　　(2023.01)

(52) U.S. Cl.
　　　CPC ...... *G11C 11/4097* (2013.01); *G11C 13/0004* (2013.01); *H10B 63/30* (2023.02); *H10B 63/80* (2023.02); *H10N 70/011* (2023.02); *G11C 2213/79* (2013.01); *H10N 70/231* (2023.02); *H10N 70/826* (2023.02)

(56) References Cited

U.S. PATENT DOCUMENTS

| | | | |
|---|---|---|---|
| 5,396,451 A * | 3/1995 | Ema | H01L 23/528 |
| | | | 365/72 |
| 5,480,822 A | 1/1996 | Hsue et al. | |
| 6,654,283 B1 | 11/2003 | Haddad | |
| 6,687,147 B2 | 2/2004 | Fricke et al. | |
| 6,731,557 B2 | 5/2004 | Beretta | |
| 6,768,683 B1 | 7/2004 | Fastow et al. | |
| 6,849,892 B2 | 2/2005 | Hideki | |
| 6,862,214 B2 | 3/2005 | Lee et al. | |
| 6,894,916 B2 | 5/2005 | Reohr et al. | |
| 7,339,814 B2 | 3/2008 | Happ | |
| 7,372,092 B2 | 5/2008 | Manning et al. | |
| 7,423,898 B2 | 9/2008 | Tanizaki et al. | |
| 7,447,062 B2 | 11/2008 | Burr et al. | |
| 7,453,716 B2 | 11/2008 | Kim et al. | |
| 7,492,033 B2 | 2/2009 | Sato et al. | |
| 7,532,508 B2 | 5/2009 | Fuji | |
| 7,675,770 B2 | 3/2010 | Asano et al. | |
| 7,742,330 B2 | 6/2010 | Takemura et al. | |
| 8,385,112 B2 * | 2/2013 | Liu | H01L 27/2436 |
| | | | 365/72 |
| 9,209,395 B2 | 12/2015 | Liu | |
| 10,573,384 B2 | 2/2020 | Liu | |
| 2003/0185085 A1 | 10/2003 | Kaneko | |
| 2004/0084702 A1 * | 5/2004 | Jeong | G11C 11/16 |
| | | | 257/E27.005 |
| 2004/0170053 A1 | 9/2004 | Lee et al. | |
| 2005/0185445 A1 | 8/2005 | Osada et al. | |
| 2005/0199913 A1 * | 9/2005 | Hofmann | H01L 27/11568 |
| | | | 438/257 |
| 2006/0120129 A1 | 6/2006 | Schloesser | |
| 2006/0176724 A1 | 8/2006 | Asano et al. | |
| 2006/0209585 A1 | 9/2006 | Tanizaki et al. | |
| 2007/0120128 A1 | 5/2007 | Sato et al. | |
| 2007/0140039 A1 | 6/2007 | Iioka | |
| 2007/0181932 A1 * | 8/2007 | Happ | H01L 45/144 |
| | | | 257/314 |
| 2007/0285960 A1 | 12/2007 | Lung et al. | |

OTHER PUBLICATIONS

Hudgens, et al., "Overview of Phase-Change Chalcogenide Nonvolatile Memory Technology", MRS Builletin, Nov. 2004, pp. 829-832.

Lacaita, et al., "Phase Change Memories; State-off-the-art, Challenges and Perspectives", Solid-State Electronics, Oct. 10, 2005, pp. 24-31.

Lai, , "Current Status of the Phase Change Memory and its Future", Electron Devices Meeting, Dec. 8-10, 2003, IEDM '03 Technical Digest, IEEE International, pp. 10.1.1-10.1.4.

Lee, et al., "Full Integration and Cell Characteristics for 64Mb Nonvolatile PRAM", 2004 Symposium on VLSI Technology Digest of Technical Papers, pp. 20-21.

Wuttig, , "Towards a Universal Memory?", Nature Materials, Apr. 2005, vol. 4, Nature Publishing Group, pp. 265-266.

* cited by examiner

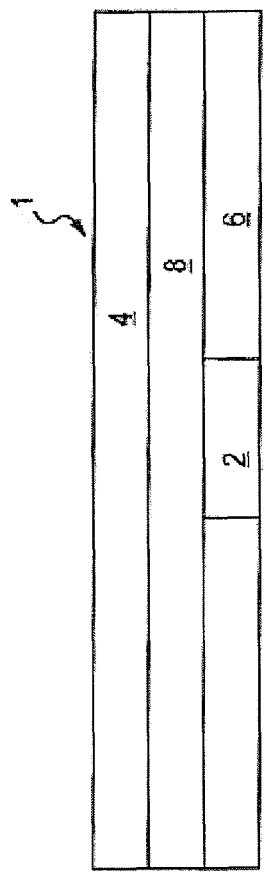
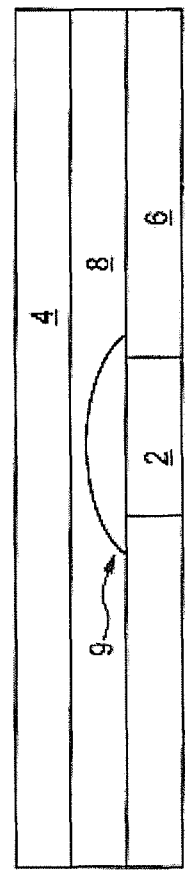
FIG. 1A - PRIOR ART
FIG. 1B - PRIOR ART

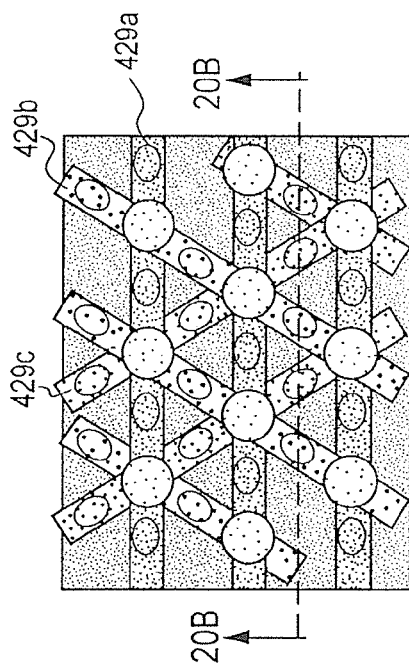
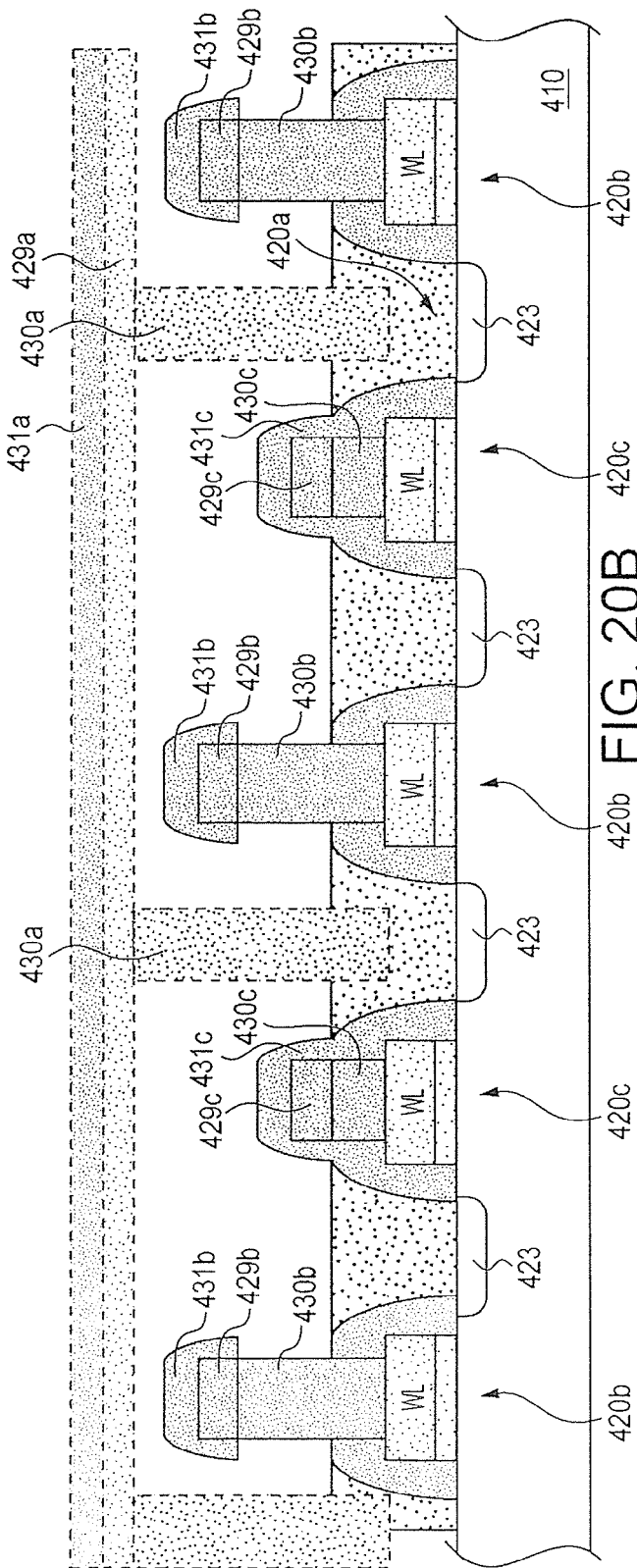
FIG. 20A
FIG. 20B

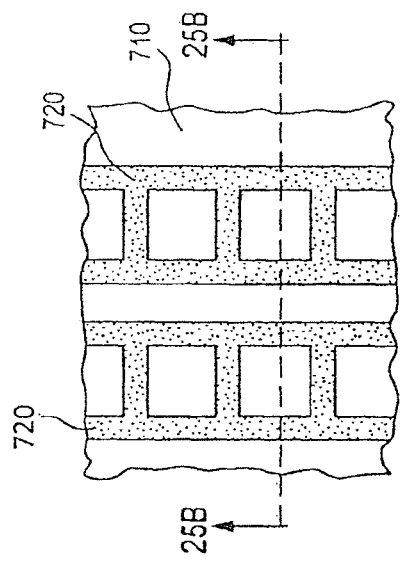
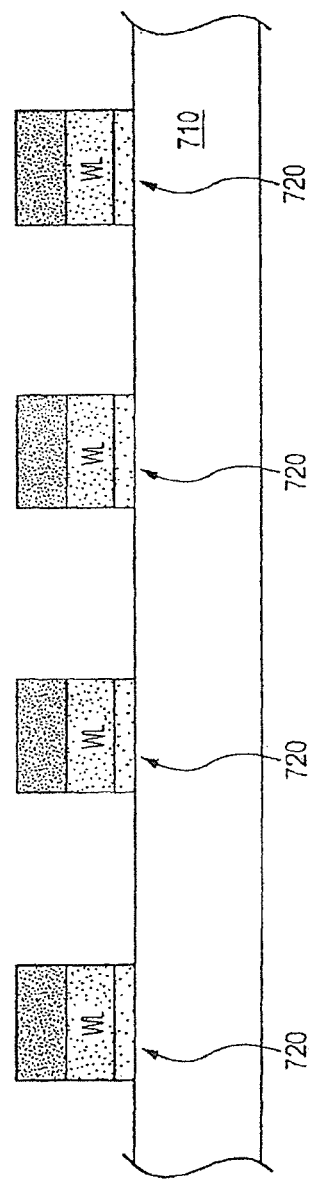
FIG. 25A
FIG. 25B

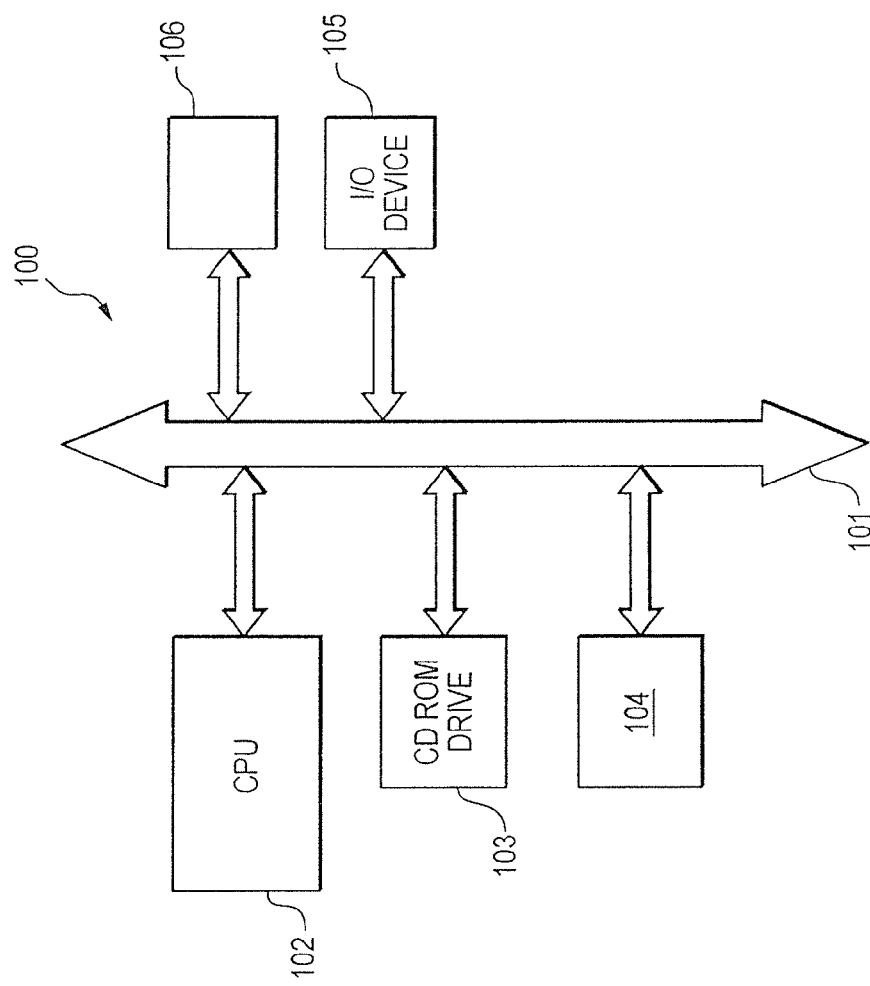

VARIABLE RESISTANCE MEMORY WITH LATTICE ARRAY USING ENCLOSING TRANSISTORS

CROSS REFERENCES

The present Application for Patent is a divisional of U.S. patent application Ser. No. 16/776,383 by Liu, entitled "Variable Resistance Memory With Lattice Array Using Enclosing Transistors," filed Jan. 29, 2020, which is a divisional of U.S. patent application Ser. No. 16/153,143 by Liu, entitled "Variable Resistance Memory With Lattice Array Using Enclosing Transistors," filed Oct. 5, 2018, which is a continuation of U.S. patent application Ser. No. 14/940,386 by Liu, entitled "Variable Resistance Memory With Lattice Array Using Enclosing Transistors," filed Nov. 13, 2015, which is a continuation of U.S. patent application Ser. No. 13/776,354 by Liu, entitled "Variable Resistance Memory With Lattice Array Using Enclosing Transistors," filed Feb. 25, 2013, which is a divisional of U.S. patent application Ser. No. 12/888,201 by Liu, entitled "Variable Resistance Memory With Lattice Array Using Enclosing Transistors," filed Sep. 22, 2010, which is a divisional of U.S. patent application Ser. No. 11/730,719 by Liu, entitled "Variable Resistance Memory With Lattice Array Using Enclosing Transistors," filed Apr. 3, 2007, assigned to the assignee hereof, and each of which is expressly incorporated by reference in its entirety herein.

FIELD OF THE INVENTION

Embodiments of the invention relate to semiconductor devices, and in particular, to variable resistance memory arrays and methods of forming and using the same.

BACKGROUND OF THE INVENTION

Non-volatile memories are useful storage devices due to their ability to maintain data absent a power supply. Materials have been investigated for use in non-volatile memory cells. One class of programmable resistance materials are phase change materials, such as chalcogenide alloys, which are capable of stably transitioning between amorphous and crystalline phases. Each phase exhibits a particular resistance state and the resistance states distinguish the logic values of a memory element formed with such materials. Specifically, an amorphous state exhibits a relatively high resistance, and a crystalline state exhibits a relatively low resistance.

A conventional phase change memory element 1, illustrated in FIGS. 1A and 1B, often has a layer of phase change material 8 between first and second electrodes 2, 4. The first electrode 2 is within a dielectric material 6. The phase change material 8 is set to a particular resistance state according to the amount of current applied between the first and second electrodes 2, 4. To obtain an amorphous state (FIG. 1B), a relatively high write current pulse (a reset pulse) is applied through the phase change memory element 1 to melt at least a portion 9 of the phase change material 8 covering the first electrode 2 for a first period of time. The current is removed and the phase change material 8 cools rapidly to a temperature below the crystallization temperature, which results in the portion 9 of the phase change material 8 covering the first electrode 2 having the amorphous state. To obtain a crystalline state (FIG. 1A), a lower current write pulse (a set pulse) is applied to the phase change memory element 1 for a second period of time (typically longer in duration than the first period of time and crystallization time of amorphous phase change material) to heat the amorphous portion 9 of the phase change material 8 to a temperature below its melting point, but above its crystallization temperature. This causes the amorphous portion 9 of the phase change material 8 to re-crystallize to the crystalline state that is maintained once the current is removed and the phase change memory element 1 is cooled. The phase change memory element 1 is read by applying a read voltage, which does not change the phase state of the phase change material 8.

BRIEF DESCRIPTION OF THE DRAWINGS

FIGS. 1A and 1B illustrate a cross-sectional view of a conventional phase change memory element.

FIG. 20A illustrates a top view of the phase change memory array of FIG. 16 at a stage of fabrication subsequent to FIG. 19A.

FIG. 20B illustrates a cross-section taken along line 20B-20B of the phase change memory array of FIG. 20A.

FIG. 25A illustrates an expanded top view of the phase change memory array of FIG. 24 at an initial stage of fabrication.

FIG. 25B illustrates a cross-section taken along line 25B-25B of the phase change memory array of FIG. 25A.

FIG. 35 is a block diagram of a processor system having a memory element incorporating a phase change memory array constructed in accordance with an embodiment of the invention.

DETAILED DESCRIPTION OF THE INVENTION

In the following detailed description, reference is made to various embodiments of the invention. These embodiments are described with sufficient detail to enable those skilled in the art to practice them. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Figure 2:
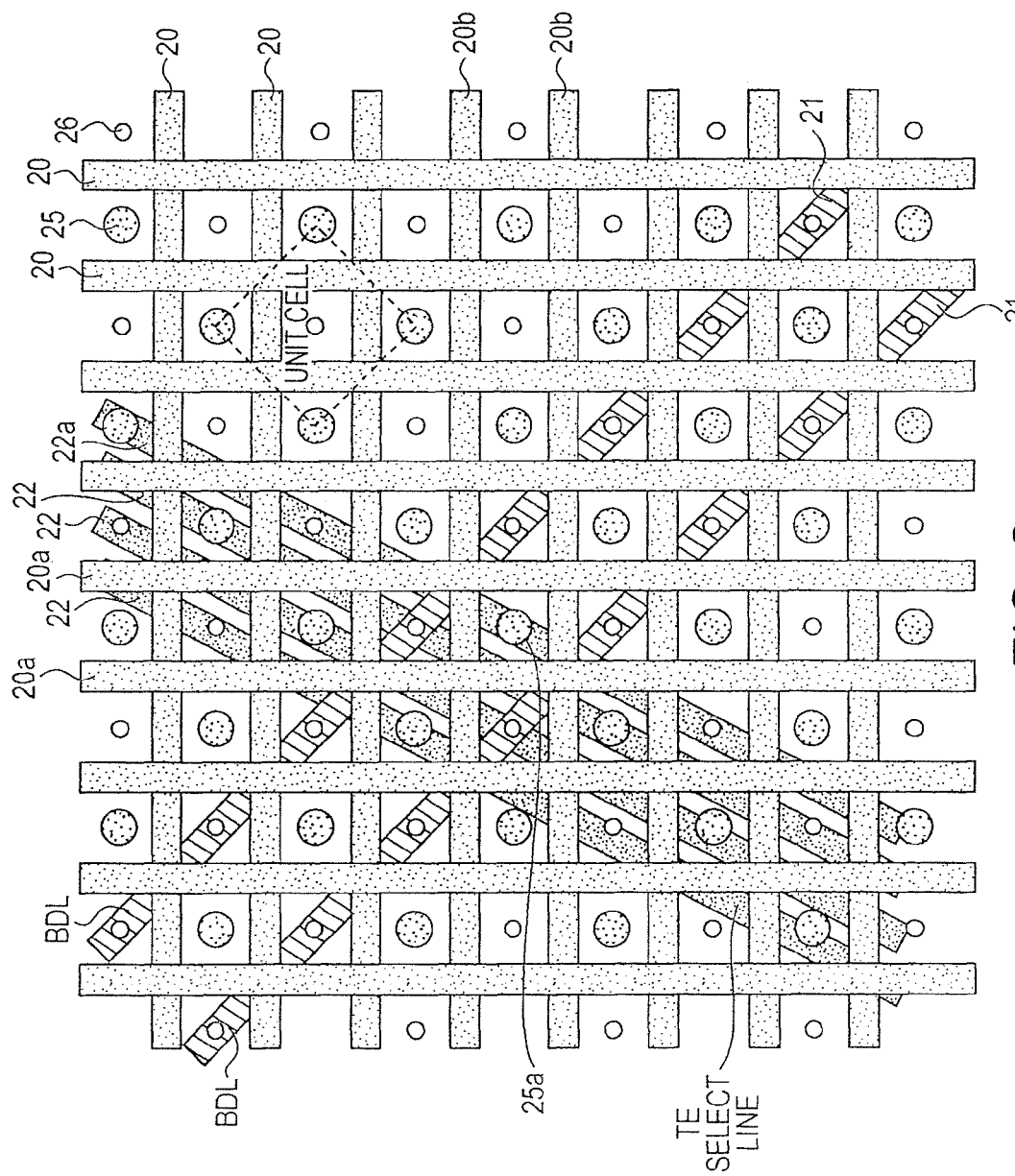
FIG. 2 illustrates a top view of a phase change memory array according to a first embodiment.

Embodiments are now explained with reference to the figures, throughout which like reference numbers indicate like features. FIG. 2 illustrates a first embodiment, in which word lines 20 run horizontally and vertically in a square lattice configuration. Each word line 20 forms transistor gates which have source/drain regions on both sides of the gate. Phase change memory elements 25 are positioned within the lattice of the word lines 20, alternating horizontally and vertically with bitline contacts 26. Bitlines 21 run diagonally between bitline contacts 26. For ease of illustration, not all bitlines are shown.

To program a selected phase change memory element 25a, two adjacent vertical word lines 20a and two adjacent horizontal word lines 20b enclosing the selected phase change memory element 25a are turned on. A top electrode select line 22a that is in contact with the selected phase change memory element 25a is also selected. For ease of illustration, not all top electrode select lines 22 are shown. All of the bitlines 21 are grounded or biased at the same voltage. The four transistors associated with the word lines 20a, 20b enclosing the phase change memory element 25a are turned on to supply programming current to the element 25a. Current flows from the selected top electrode select line 22a through the transistors associated with the word lines surrounding the phase change memory element 25a into the nearest bitline contacts 26a.

Figure 3A:
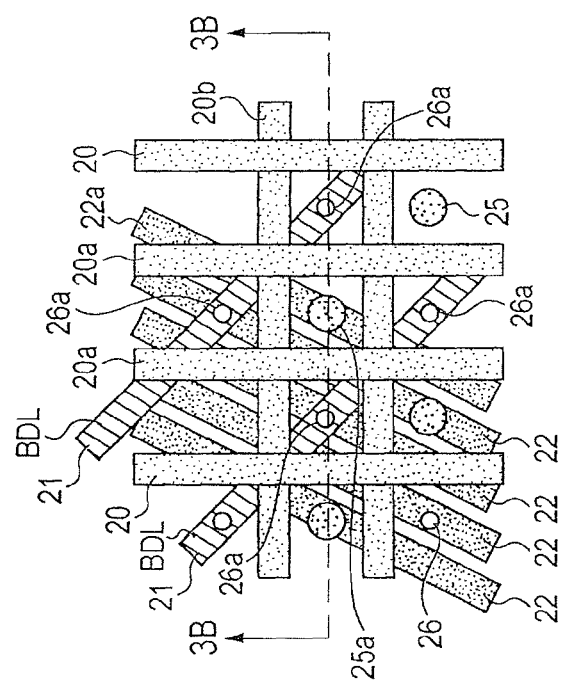
FIG. 3A illustrates an expanded top view of the phase change memory array of FIG. 2.
Figure 3B:
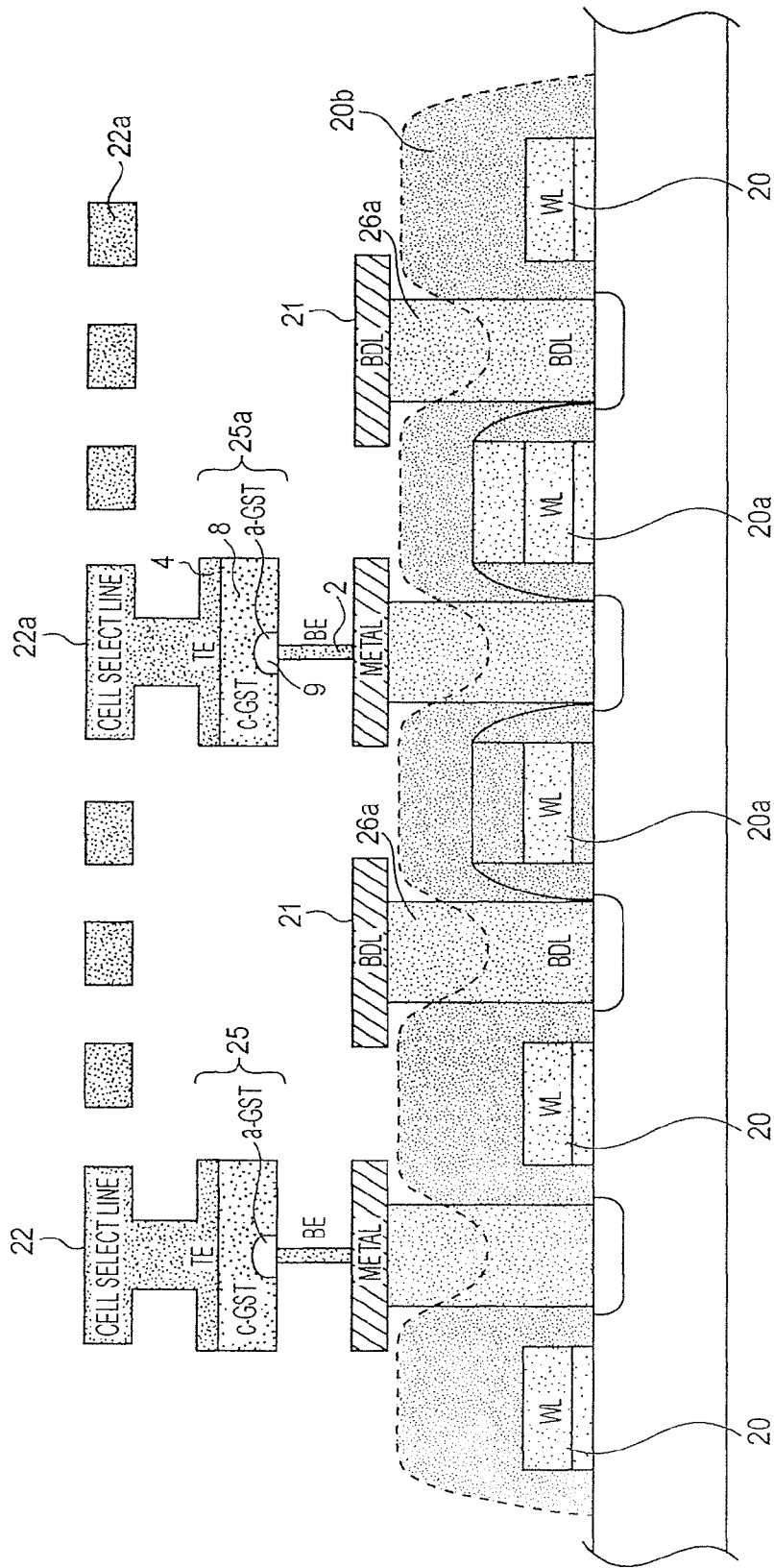
FIG. 3B illustrates a cross-section taken along line 3B-3B of the phase change memory array of FIG. 3A.

Turning now to FIG. 3A, an expanded top view of a portion of the phase change memory array of FIG. 2 is shown. The selected phase change memory element 25a is enclosed by word lines 20a, 20b. FIG. 3B illustrates a cross-section taken along line 3B-3B of the phase change memory array of FIG. 3A. Top electrode select lines 22 run above the phase change memory elements 25, contacting their top electrodes. When the selected top electrode select line 22a is turned on, current is supplied by the selected top electrode select line 22a and passes through the selected phase change memory element 25a. Since the bitlines 21 are grounded or biased at the same voltage, the current through the selected phase change memory element 25a goes across all four transistors defined by four segments of word lines 20a, 20b to adjacent bitline contacts 26a.

Figure 4A:
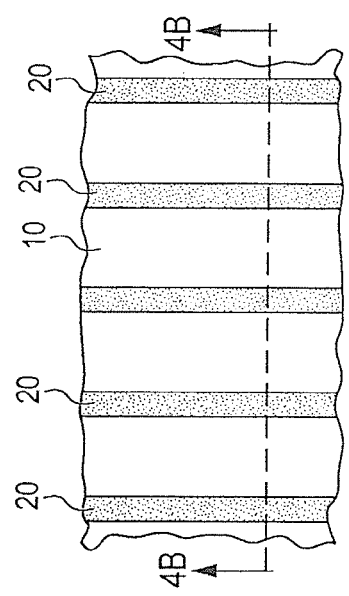
FIG. 4A illustrates an expanded top view of the phase change memory array of FIG. 2 at an initial stage of a first method of fabrication.
Figure 4B:
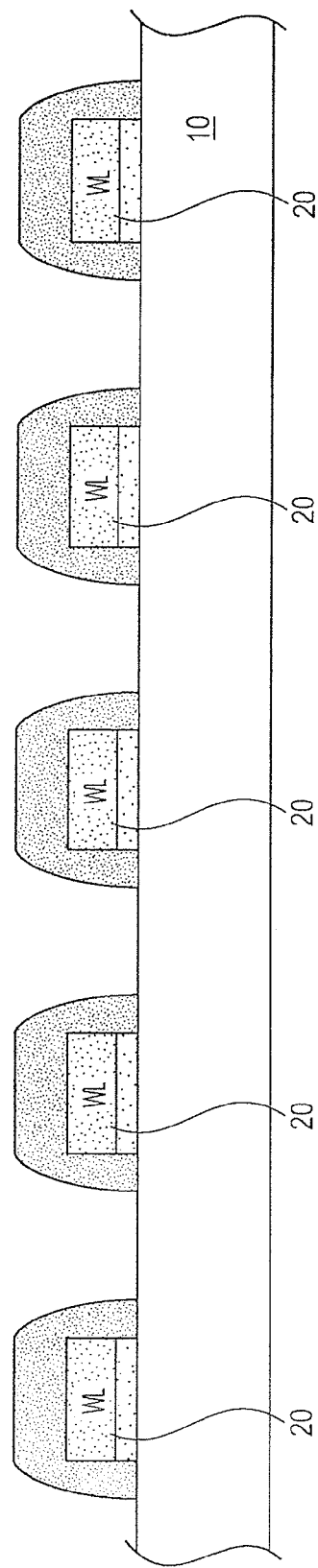
FIG. 4B illustrates a cross-section taken along line 4B-4B of the phase change memory array of FIG. 4A.

FIGS. 4A-5B illustrate a first method of forming the phase change memory array of FIG. 2. FIG. 4A is an expanded top view of the memory array at an initial stage of fabrication according to the first method. FIG. 4B is a cross-section of FIG. 4A, taken across line 4B-4B. A first array of vertically-aligned word lines 20 are formed on a silicon substrate 10 using any known fabrication method. An ion implantation process may be performed to dope regions in the silicon that are not protected by the vertically-aligned word lines 20 so that the desired silicon doping profile is preserved. No trench isolation regions are necessary.

Figure 5A:
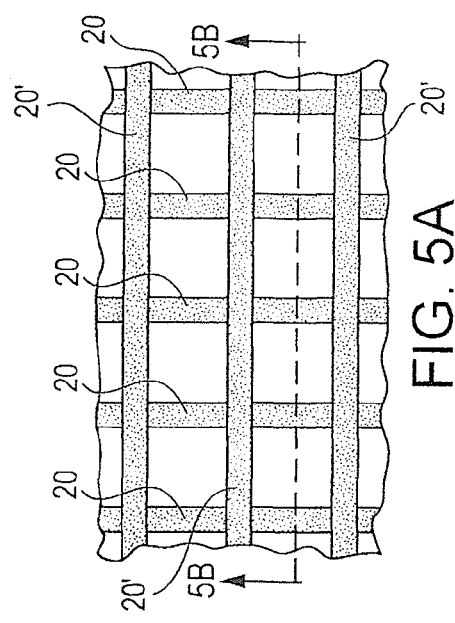
FIG. 5A illustrates a top view of the phase change memory array of FIG. 2 at a stage of fabrication subsequent to FIG. 4A.
Figure 5B:
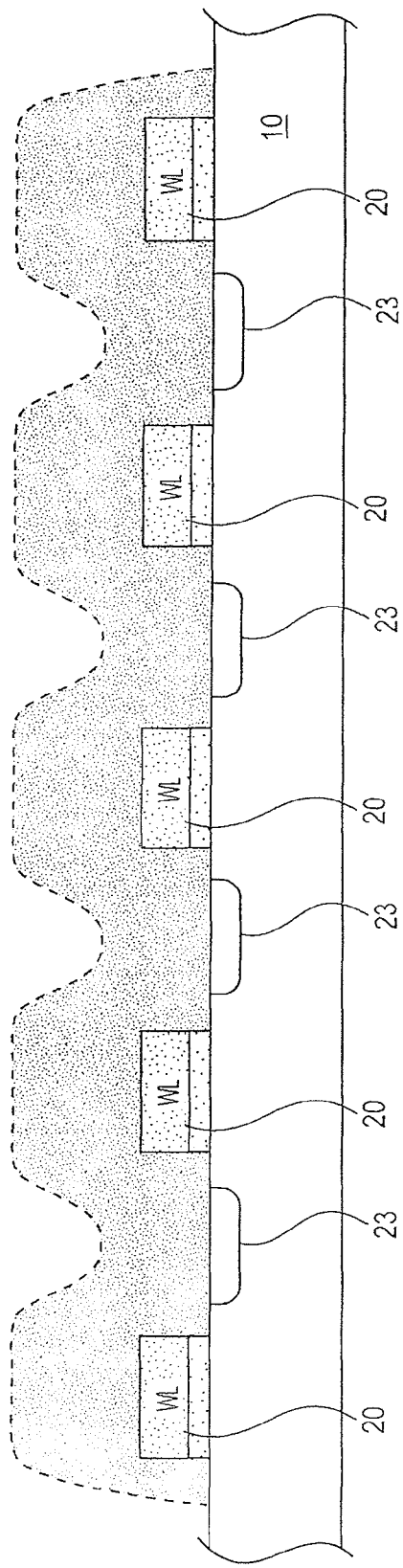
FIG. 5B illustrates a cross-section taken along line 5B-5B of the phase change memory array of FIG. 5A.

A cleaning process may be performed to remove damaged oxide on the silicon substrate 10 before forming a second array of horizontally-aligned word lines 20', as shown in FIGS. 5A and 5B. Methods such as photolithography and dry etching may be used to form the horizontally-aligned word lines 20'. The horizontally-aligned word lines 20' are perpendicular to the vertically-aligned word lines 20. An optional strip of nitride spacers may be formed on the word lines 20, before source/drain regions 23 are formed by one or more high-dose implants. A silicide metal such as Co, Ni, or Ti is deposited for silicidation (or salicidation if the gate stacks of the word lines are polysilicon/TEOS gate stacks) of the source/drain regions 23.

Self-aligned metal contacts and bitline contacts 26a are formed over the source/drain regions 23, as shown in FIG. 3B. Material for bitlines 21 are deposited and patterned. The phase change memory elements 25 are formed in layers in the shape of mesas or stripes, as shown in FIGS. 1A and 1B, and the top electrode select lines 22 are formed with a contact to the top electrode 4 of the phase change memory element 25, which is in contact with the phase change memory material 8 having a portion 9 in contact with the bottom electrode 2. Depending upon the desired orientation of the top electrode select lines 22, they may be provided in one or more layers, as long as no two adjacent phase change memory elements 25 are contacted by the same top electrode select line 22.

Figure 6A:
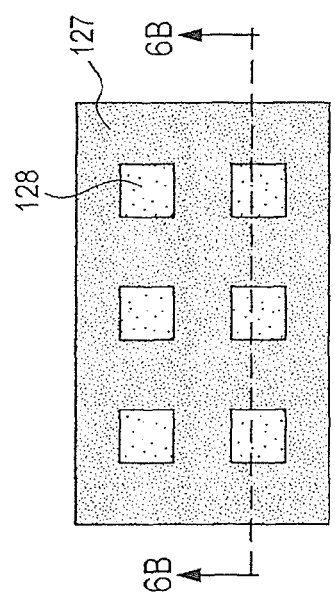
FIG. 6A illustrates an expanded top view of the phase change memory array of FIG. 2 at an initial stage of a second method of fabrication.
Figure 6B:
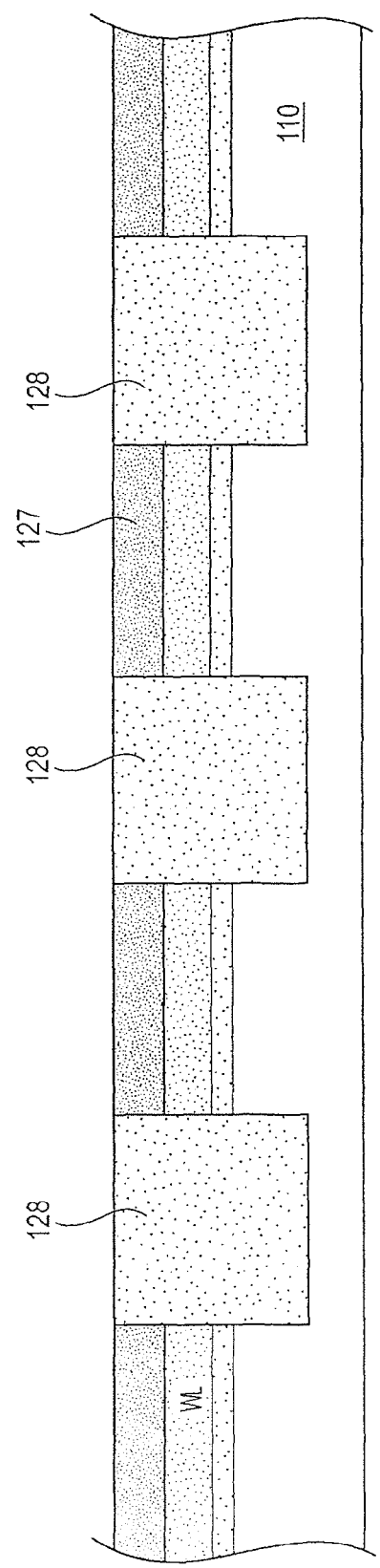
FIG. 6B illustrates a cross-section taken along line 6B-6B of the phase change memory array of FIG. 6A.

In a second method of forming the phase change memory array of FIG. 2, word line gate materials 127 are deposited over a silicon substrate 110, as shown in FIGS. 6A and 6B. FIG. 6B is a cross-section taken across line 6B-6B in the expanded top view of FIG. 6A. The silicon substrate 110 may be provided with ion implantation to define a desired dopant profile. Photolithograpy and dry etch processes may be used to etch an array of square patterns into the silicon substrate 110, and filled with high-density plasma (HDP) oxide to form shallow trench isolation (STI) regions 128.

Figure 7A:
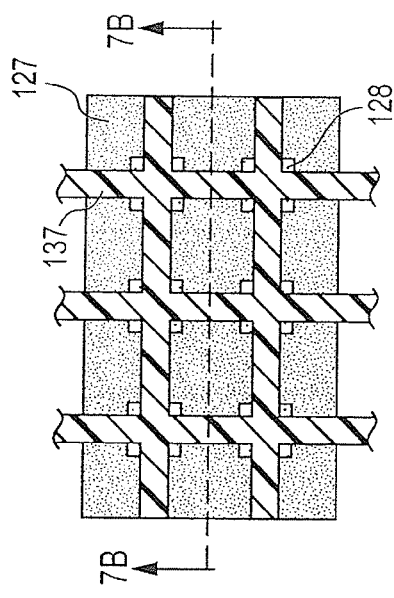
FIG. 7A illustrates a top view of the phase change memory array of FIG. 2 at a stage of fabrication subsequent to FIG. 6A.
Figure 7B:
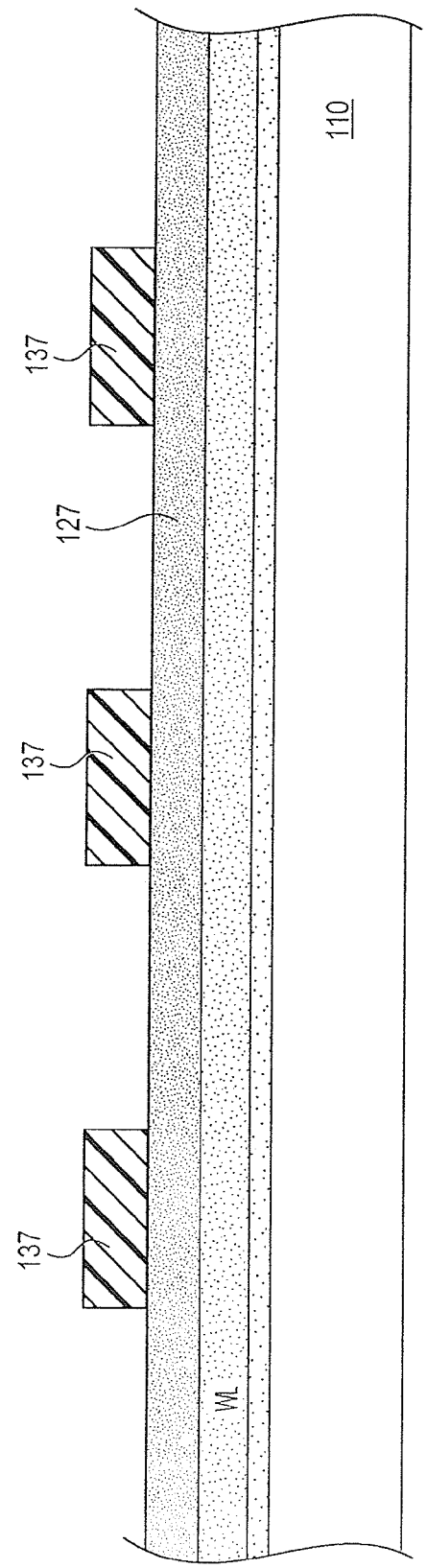
FIG. 7B illustrates a cross-section taken along line 7B-7B of the phase change memory array of FIG. 7A.

As shown in FIG. 7A, a resist pattern 137 is provided over the substrate 110, such that strips of resist material intersect perpendicularly over the STI regions 128. FIG. 713 illustrates a cross-section taken across line 7B-7B in the expanded top view of 7A.

Figure 8A:
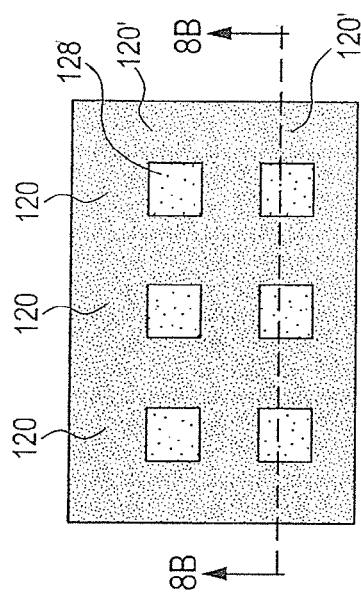
FIG. 8A illustrates a top view of the phase change memory array of FIG. 2 at a stage of fabrication subsequent to FIG. 7A.
Figure 8B:
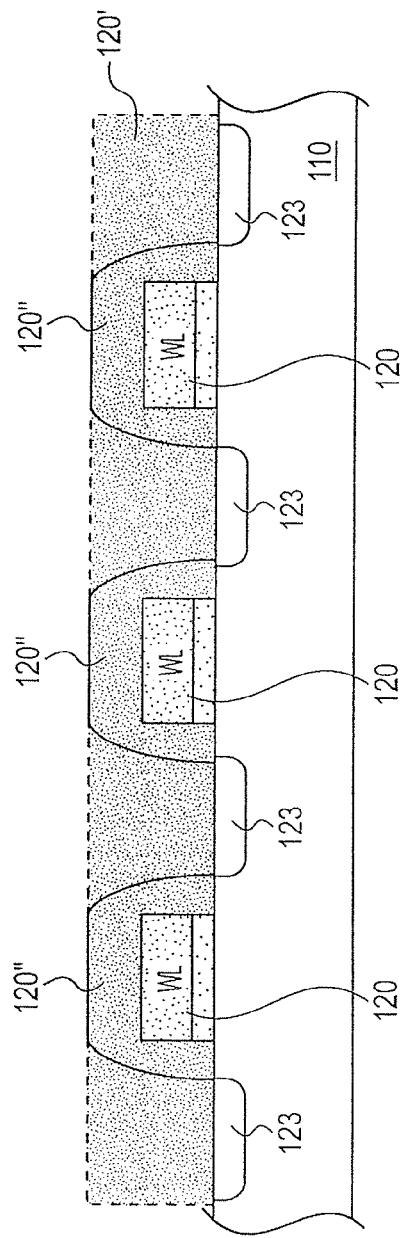
FIG. 8B illustrates a cross-section taken along line 8B-8B of the phase change memory array of FIG. 8A.

A photolithography and dry etch process is performed to produce vertically- and horizontally-aligned gate stacks of word lines 120, 120' that intersect over the STI regions 128, as shown in the expanded top view of FIG. 8A. The photolithography and dry etch process is used to etch isolated gate stacks of word lines 120, 120', stopping above the silicon substrate 110, as shown in the cross-section illustrated in FIG. 8B, taken across line 8B-8B of FIG. 8A. Nitride spacers 120" are formed to complete the formation of the transistors and source/drain regions 123 are formed. A silicide metal (such as Co, Ni or Ti) is deposited for source/drain silicidation (or salicidation for polysilicon/TEOS gate stacks).

Figure 9A:
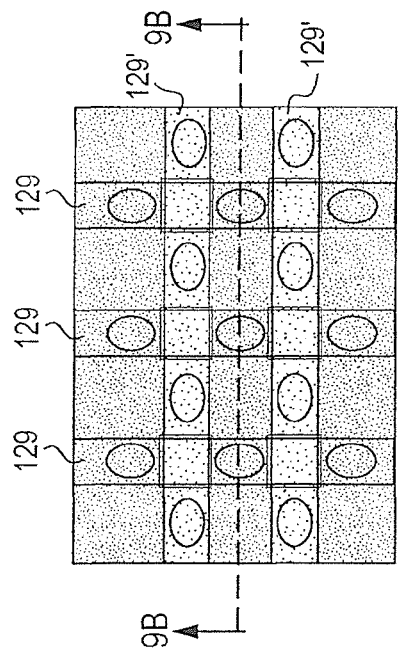
FIG. 9A illustrates a top view of the phase change memory array of FIG. 2 at a stage of fabrication subsequent to FIG. 8A.
Figure 9B:
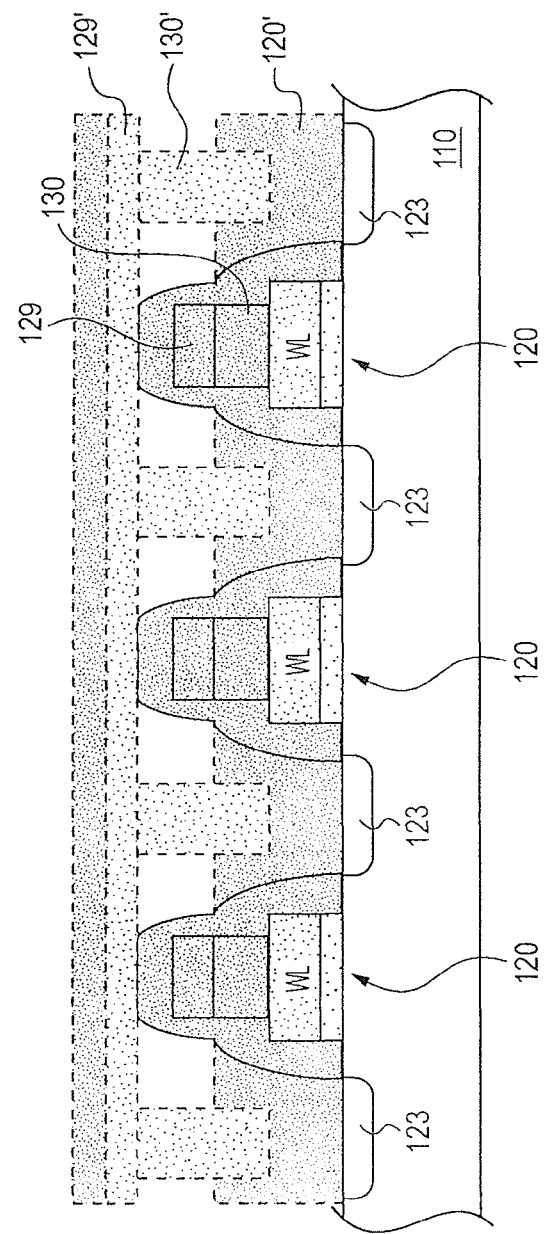
FIG. 9B illustrates a cross-section taken along line 9B-9B of the phase change memory array of FIG. 9A.

Because the gate stacks of word lines 120, 120' are isolated from each other, they must be electrically connected in order to form continuous word lines. FIG. 9A illustrates an expanded top view of this connection and FIG. 9B is a cross-section taken along line 9B-9B of FIG. 9A. As shown in FIG. 9B, contacts 130 are formed over the vertically-aligned gate stacks of word lines 120 to electrically connect the vertically-aligned gate stacks of word lines 120 with vertically-aligned straps 129. Contacts 130' are formed over the horizontally-aligned gate stacks of word lines 120' to electrically connect the horizontally aligned gate stacks of word lines 120' with horizontally-aligned straps 129'. Both vertically- and horizontally-aligned straps 129, 129' are typically conductive metal lines having a nitride encapsulating layer provided over them to electrically isolate the straps 129, 129'.

Figure 10A:
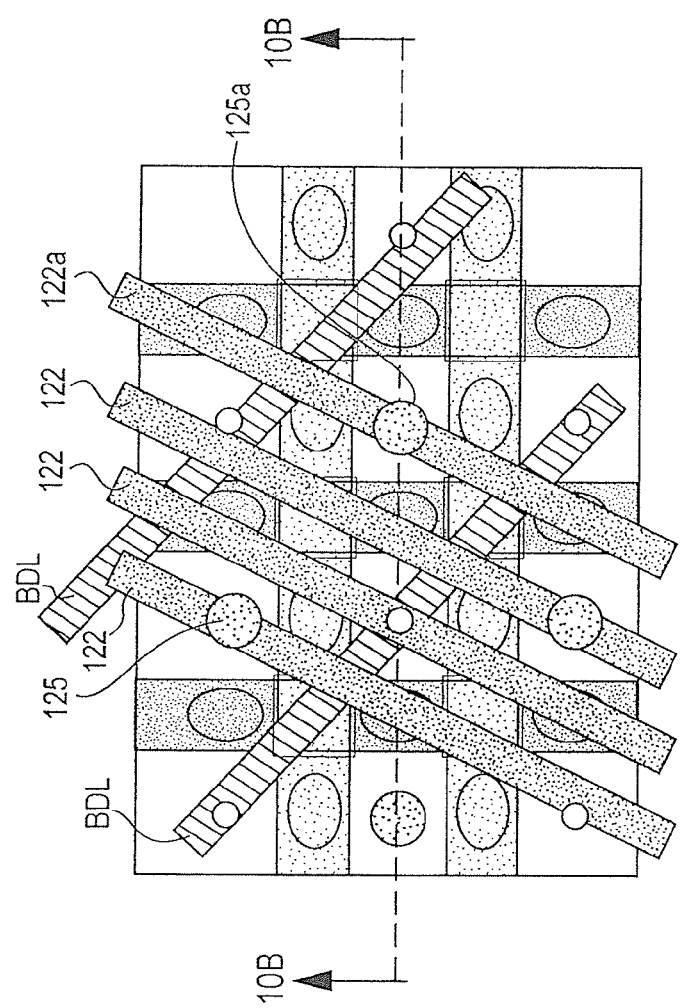
FIG. 10A illustrates a top view of the phase change memory array of FIG. 2 at a stage of fabrication subsequent to FIG. 9A.
Figure 10B:
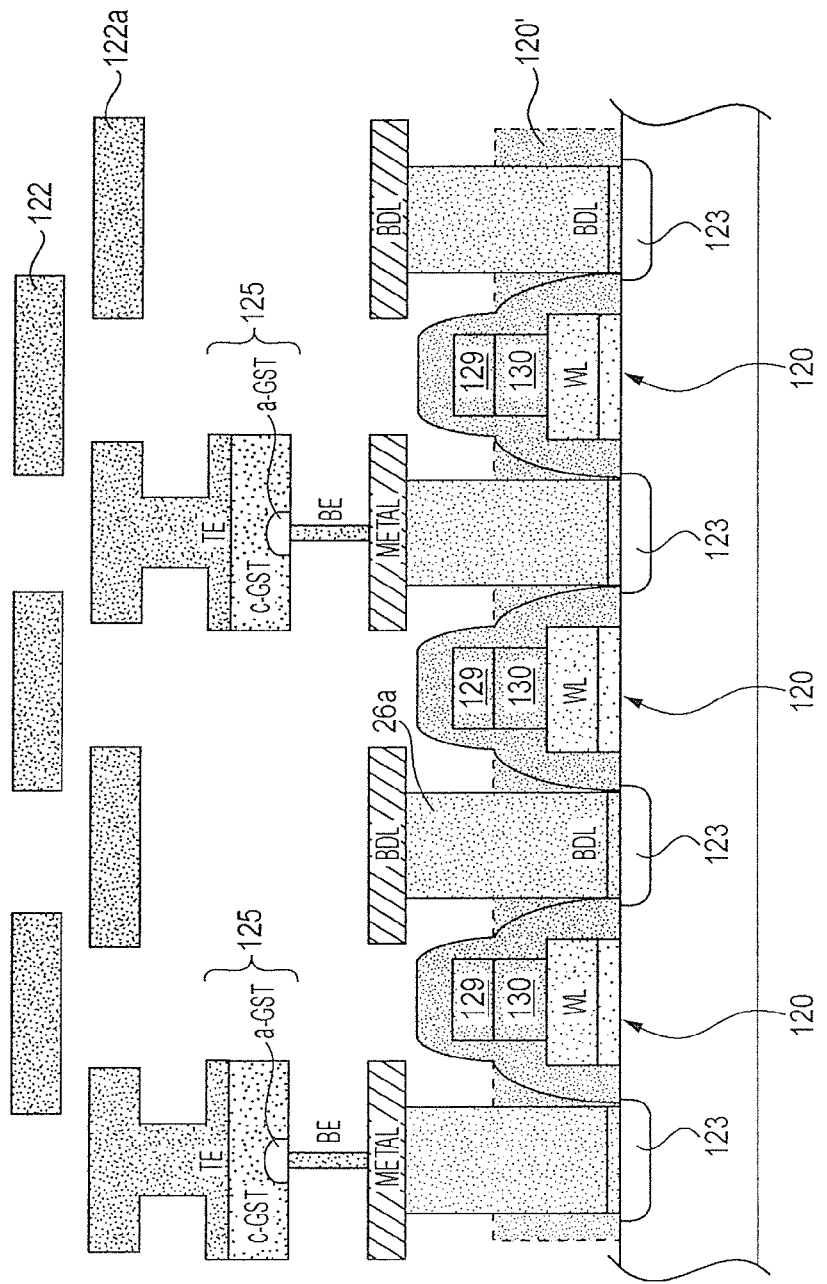
FIG. 10B illustrates a cross-section taken along line 10B-10B of the phase change memory array of FIG. 10A.

Depending upon the desired orientation of the top electrode select lines 122, they may be provided in one or more layers, as long as no two adjacent phase change memory elements 125 are contacted by the same top electrode select line 122, as shown in FIG. 10B, which is a cross-section of expanded top view 10A taken along line 10B-10B.

Figure 11A:
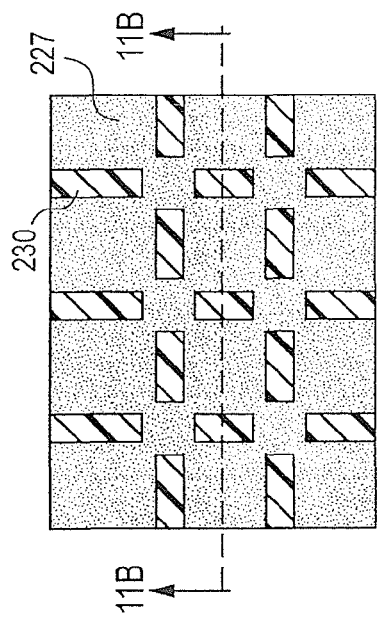
FIG. 11A illustrates an expanded top view of the phase change memory array of FIG. 2 at an initial stage of a third method of fabrication.
Figure 11B:
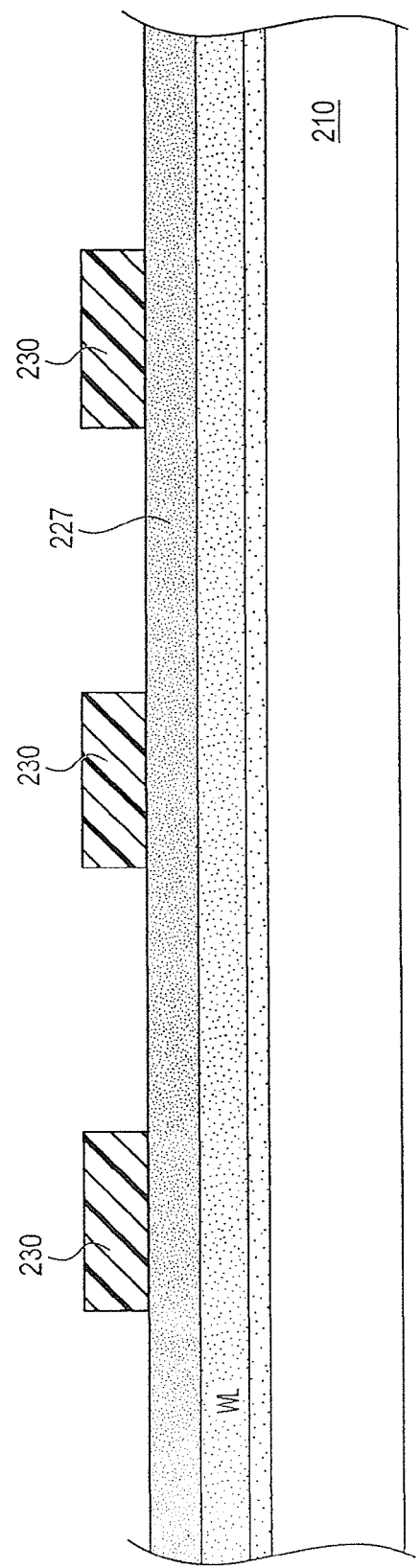
FIG. 11B illustrates a cross-section taken along line 11B-11B of the phase change memory array of FIG. 11A.

In a third method of forming the phase change memory array of FIG. 2, gate materials 227 are deposited over a silicon substrate 210, as shown in FIGS. 11A and 11B. FIG. 11B is a cross-section taken across line 11B-11B in the expanded top view of FIG. 11A. The silicon substrate 210 may be provided with ion implantation to define a desired dopant profile. A resist 227 is patterned as shown in FIG. 11A. The pattern of the resist 227 defines the location of the isolated gate stacks, as will be described below.

Figure 12A:
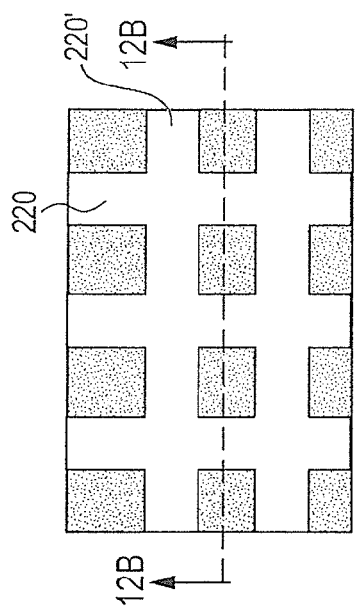
FIG. 12A illustrates a top view of the phase change memory array of FIG. 2 at a stage of fabrication subsequent to FIG. 11A.
Figure 12B:
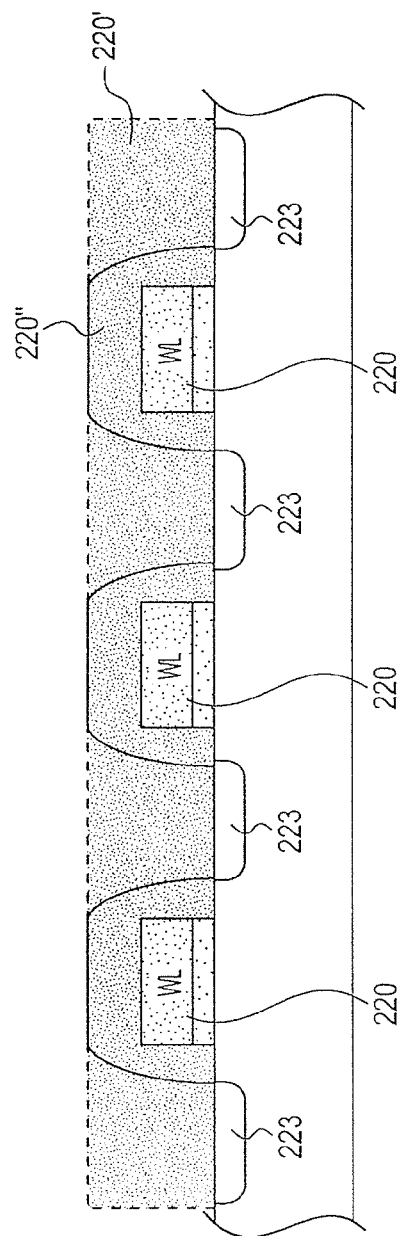
FIG. 12B illustrates a cross-section taken along line 12B-12B of the phase change memory array of FIG. 12A.

A photolithography and dry etch process is performed to produce vertically- and horizontally-aligned word lines 220, 220', as shown in the expanded top view of FIG. 12A. The photolithography and dry etch process is used to etch isolated gate stacks, stopping above the silicon substrate 210, as shown in the cross-section illustrated in FIG. 12B, taken across line 12B-12B of FIG. 12A. Nitride spacers 220" are formed to complete the formation of the transistors and source/drain regions 223 are formed. The remainder of the steps are performed in accordance with the second method described above with respect to FIGS. 9A and 9B.

Figure 13A:
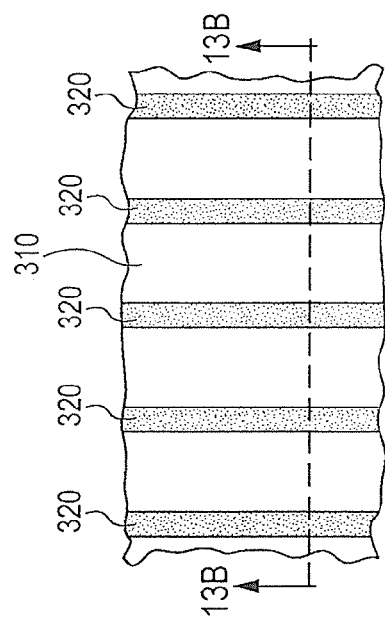
FIG. 13A illustrates an expanded top view of the phase change memory array of FIG. 2 at an initial stage of a fourth method of fabrication.
Figure 13B:
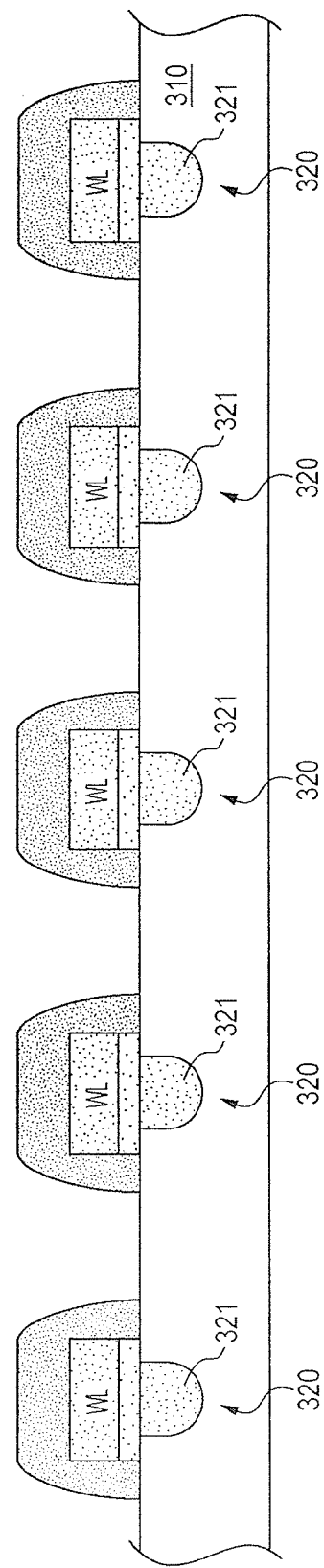
FIG. 13B illustrates a cross-section taken along line 13B-13B of the phase change memory array of FIG. 13A.

In a fourth method of forming the phase change memory array of FIG. 2, a first array of parallel word lines 320 are formed on a substrate 310 using a recessed transistor process, as shown in FIG. 13B, which is a cross-section taken across 13B-13B in expanded top view 13A. Because the bottom layer 321 of the recessed word lines 320 are formed within trenches in the substrate 310, recessed word lines 320 have a lower topography than the word lines in the arrays described above. By forming recessed word lines 320, the second array of parallel word lines that will be formed perpendicular to the first array 320 may also have a reduced topography. The remainder of the steps are performed in accordance with the first method described above with respect to FIGS. 1A, 1B, 3B, 5A and 5B.

A phase change memory array with word lines configured in a lattice configuration having enclosing transistors around the phase change memory elements can provide to each phase change memory element a current that is more than four times greater than a conventional planar transistor. At the same time, this array optimizes the silicon area by taking advantage of the symmetry of the array to minimize the unit cell area by sharing transistor source/drain regions with adjacent transistors in a two-dimensional configuration. In the embodiment of FIG. 2, the unit cell area is $8f^2$ with more than four times the transistor current drive than can be obtained from a one-transistor current drive for a conventional $8f^2$ unit cell layout. The circuit biasing scheme is similar to the conventional planar transistor circuits with perpendicular word lines and top electrode select lines. However, the fabrication process is simpler since no trench isolation regions are needed for element isolation.

Figure 14:
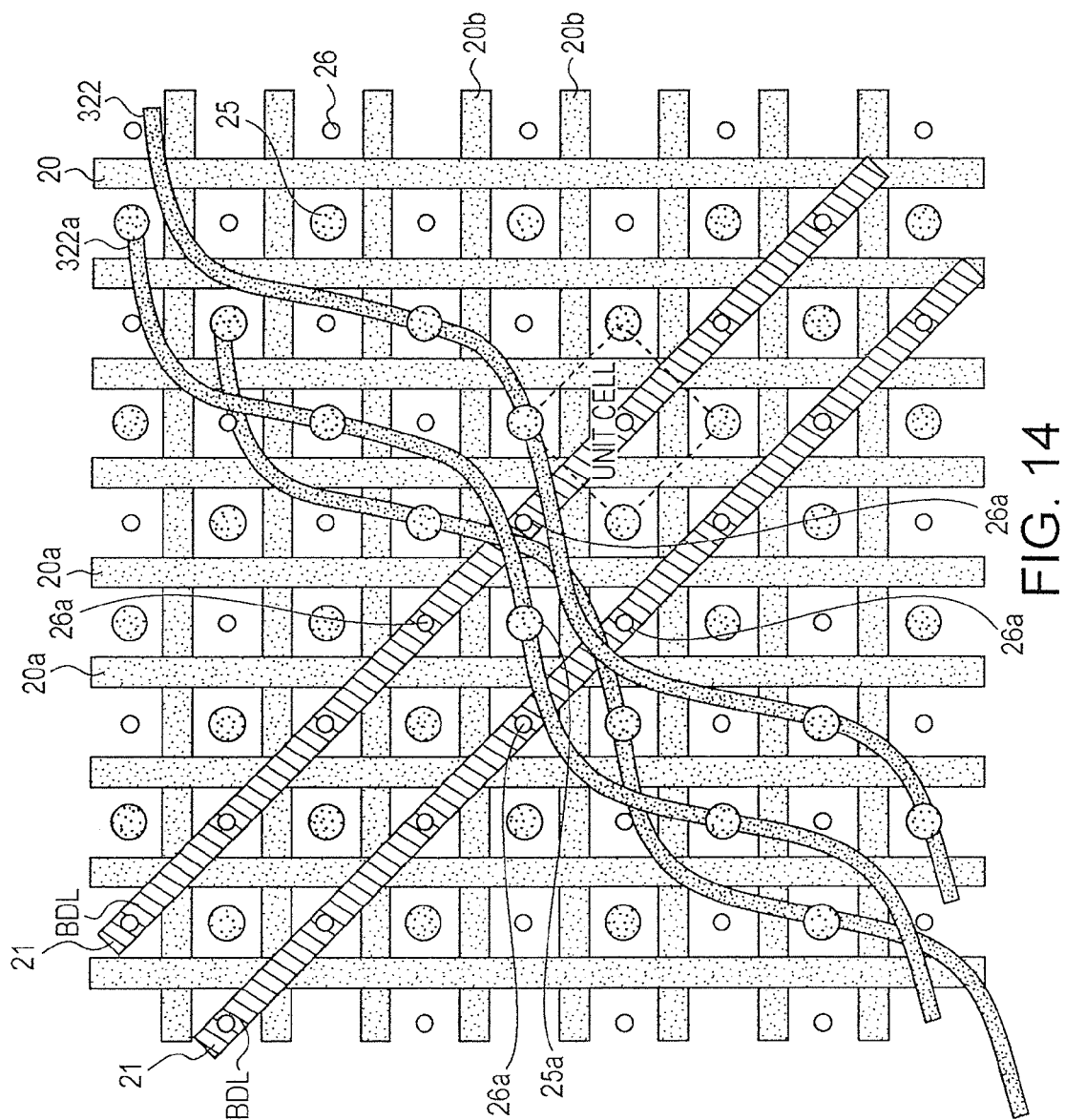
FIG. 14 illustrates a top view of a phase change memory array according to a second embodiment.

FIG. 14 illustrates a second embodiment in which, similar to the embodiment of FIG. 2, the word lines 20 run horizontally and vertically in a square lattice configuration. The phase change memory elements 25 are positioned within the lattice of the word lines 20, alternating horizontally and vertically with bitline contacts 26. The bitlines 21 run diagonally between bitline contacts 26. For ease of illustration, not all bitlines are shown.

The top electrode select lines 322 have a "wavy" configuration such that every other diagonally adjacent phase change memory elements 25 are in contact with the same top electrode select line 322, but no two adjacent phase change memory elements 25 are in contact with the same top electrode select line 322. For ease of illustration, not all top electrode select lines are shown.

This configuration of top electrode select lines 322 has a benefit over the configuration of FIG. 2, since fewer top electrode select lines 322 are necessary and may be relatively easier to pattern.

Figure 15A:
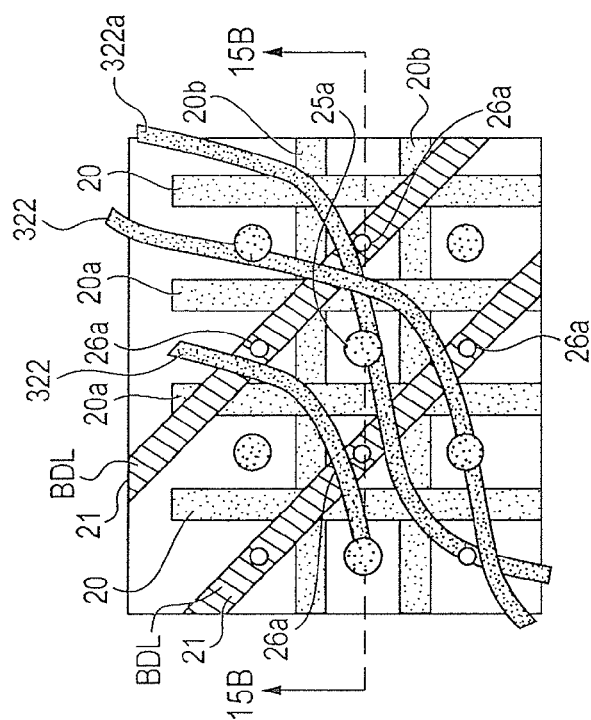
FIG. 15A illustrates an expanded top view of the phase change memory array of FIG. 14.
Figure 15B:
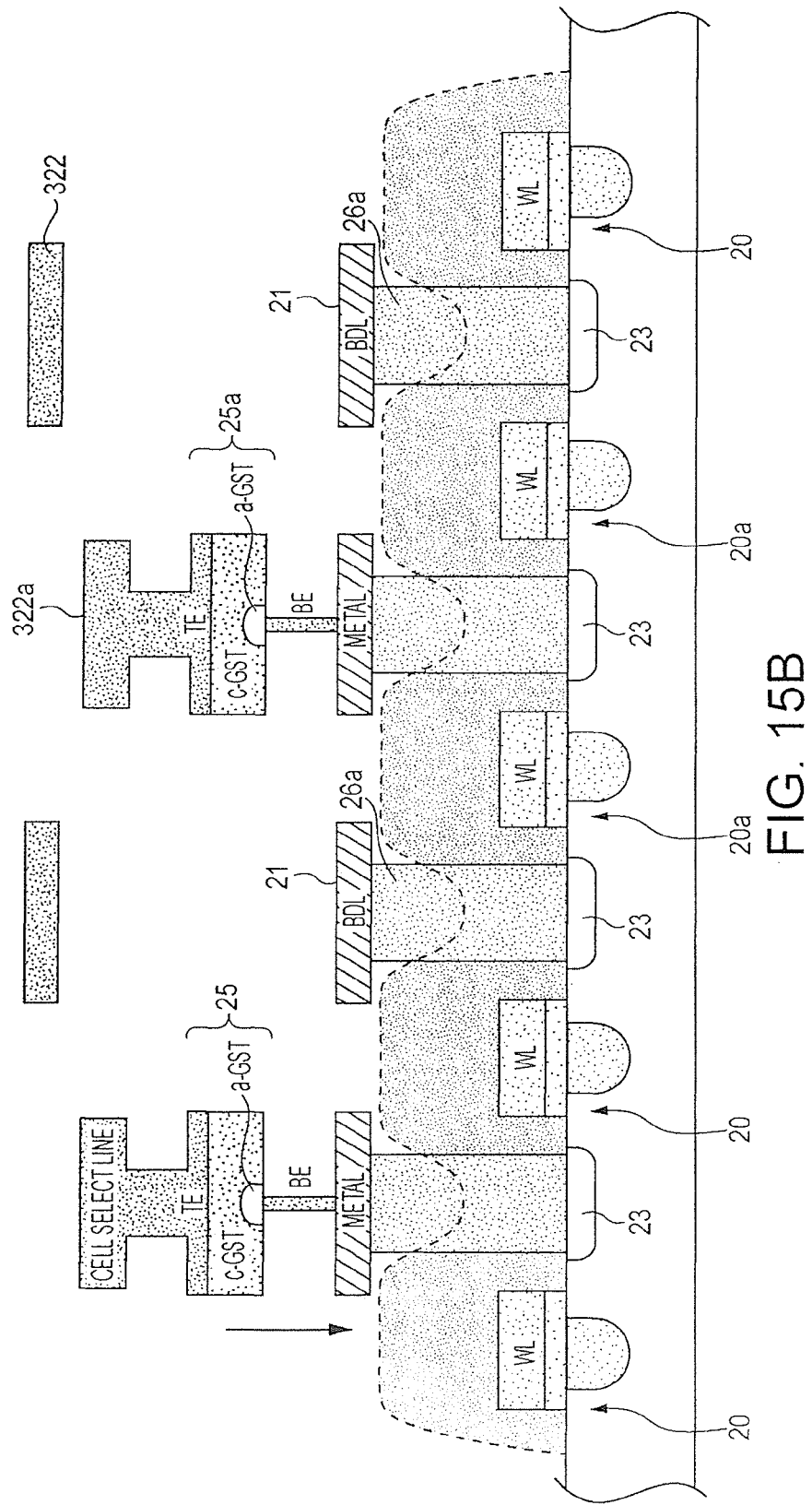
FIG. 15B illustrates a cross-section taken along line 15B-15B of the phase change memory array of FIG. 15A.

Otherwise, the methods for forming the second embodiment illustrated in FIG. 14 are the same as the methods for forming the first embodiment illustrated in FIG. 2. As shown in the expanded top view of FIG. 15A and cross-section taken along line 15B-15B in FIG. 15B, the word lines 20, phase change memory elements 25, bitline contacts 26 and bitline 21 have the same configuration as the embodiment in FIG. 2. Only the top electrode select lines 322 have a different configuration, being curved around every other phase change memory element and making contact with every other phase change memory element on a diagonal line.

Figure 16:
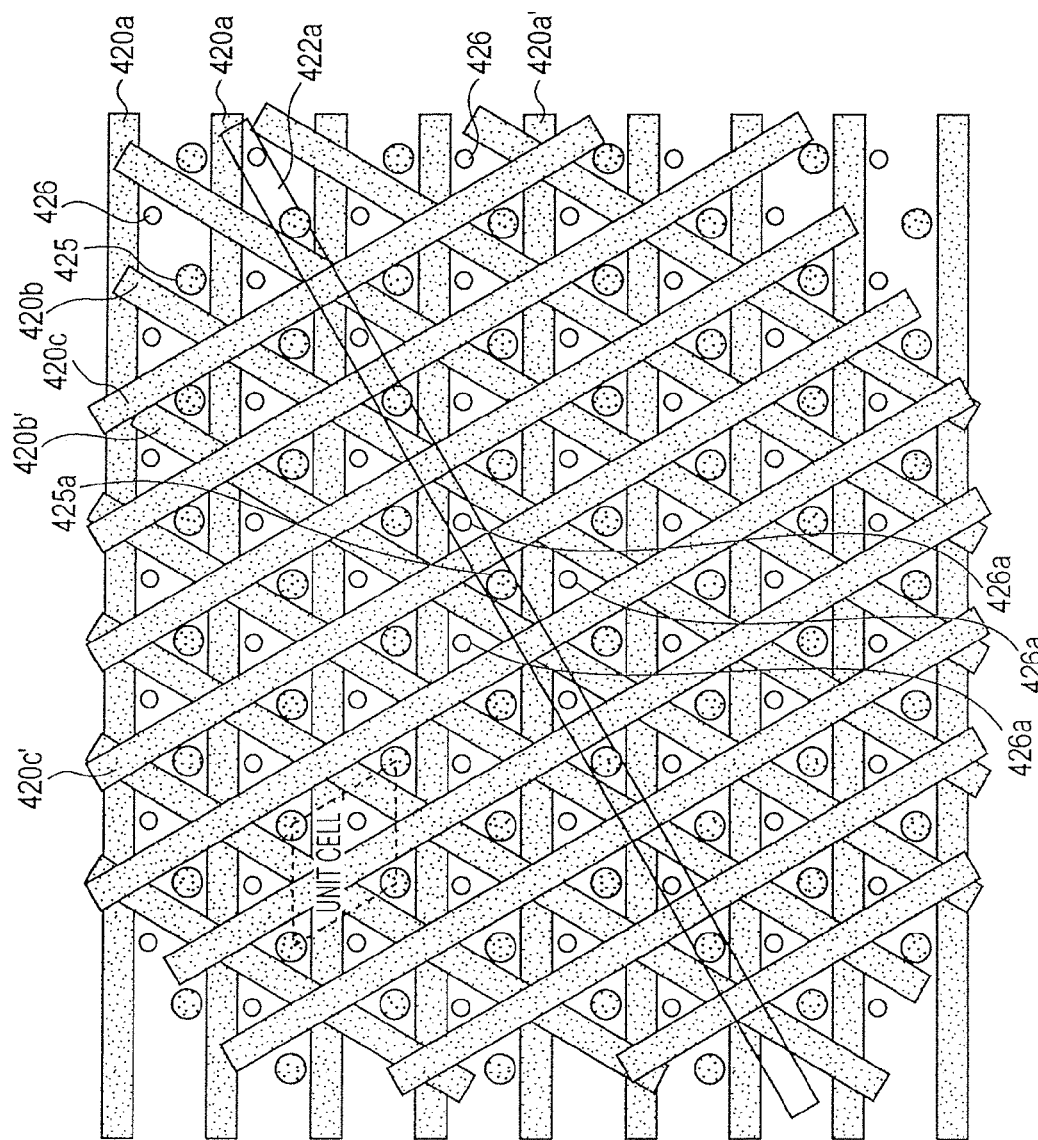
FIG. 16 illustrates a top view of a phase change memory array according to a third embodiment.

FIG. 16 illustrates a third embodiment in which the word lines 420a, 420b, 420c run at 60 degree angles with respect to each other in a hexagonal lattice configuration. The phase change memory elements 425 are positioned within a lattice formed of a first array of horizontal word lines 420a, a second array of word lines 420b rotated at a +60 degree angle from the first array of word lines 420a, and a third array of word lines 420c rotated at a −60 degree angle from horizontal word lines 420a. The bitline contacts 426 are also positioned within the lattice formed of word lines 420a, 420b, 420c, alternating with the phase change memory elements 425, so that no two adjacent enclosures formed by word lines 420a, 420b, 420c have phase change memory elements 425 in them and no two adjacent enclosures formed by word lines 420a, 420b, 420c have bitline contacts 426 in them. The bitline contacts 426 may be individually addressed, or can be grounded or biased at the same voltage. For ease of illustration, not all bitlines are shown.

To program a selected phase change memory element 425a, the three word lines 420a', 420b', 420c' enclosing the selected phase change memory element 425a are turned on. A top electrode select line 422a that is in contact with the selected phase change memory element 425a is also selected. The top electrode select lines 422, although shown here with 422a in a straight line, may have any configuration since no two phase change memory elements 425 are adjacent to each other. For ease of illustration, not all top electrode select lines are shown. All of the bitline contacts 426 are grounded or biased at the same voltage. The three transistors enclosing the phase change memory element 425a are turned on to supply programming current to the element 425a. Current flows from the selected top electrode select line 422a through the phase change memory element 425a into the three nearest bitline contacts 426a.

The embodiment of FIG. 16 having word lines configured in a hexagonal lattice configuration with three enclosing transistors around the phase change memory elements can provide to each phase change memory element a current that is more than three times greater than a conventional planar transistor. At the same time, this array optimizes the silicon area by taking advantage of the symmetry of the array to minimize the unit cell area by sharing transistor source/drain regions with adjacent transistors. In the embodiment of FIG. 16, the unit cell area is $2\sqrt{3}f^2$.

Figure 17A:
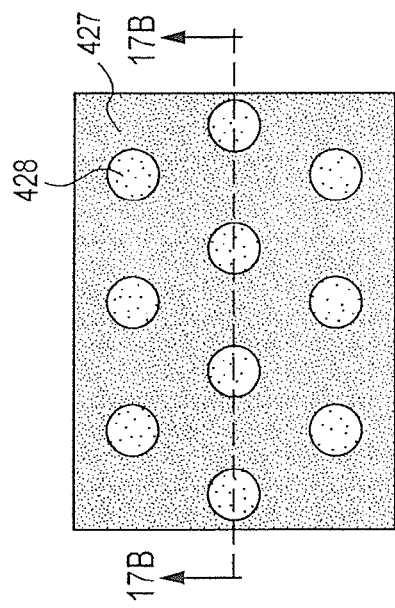
FIG. 17A illustrates an expanded top view of the phase change memory array of FIG. 16 at an initial stage of fabrication.
Figure 17B:
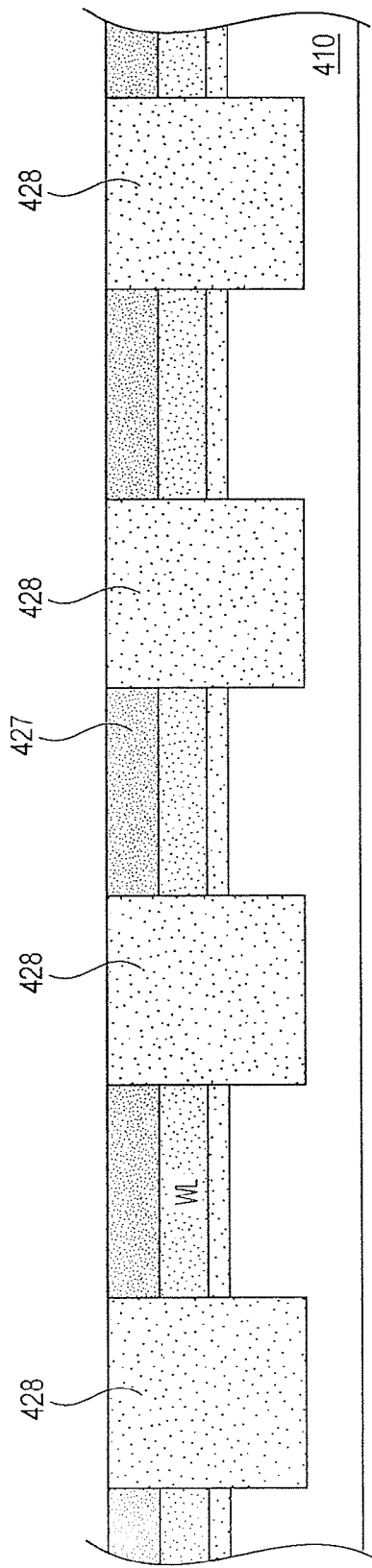
FIG. 17B illustrates a cross-section taken along line 17B-17B of the phase change memory array of FIG. 17A.

Turning now to FIGS. 17A-21B, which illustrate the process by which the embodiment of FIG. 16 is formed, gate materials 427 are deposited over a silicon substrate 410, as shown in FIGS. 17A and 17B. FIG. 17A illustrates an expanded top view of an initial stage of fabrication and FIG. 1713 is a cross-section taken across line 17B-17B of FIG. 17A. The silicon substrate 410 may be provided with ion implantation to define a desired dopant profile. Photolithograpy and dry etch processes may be used to etch a hexagonal array pattern into the silicon substrate 410, and filled with high-density plasma (HDP) oxide to form shallow trench isolation (STI) regions 428.

Figure 18A:
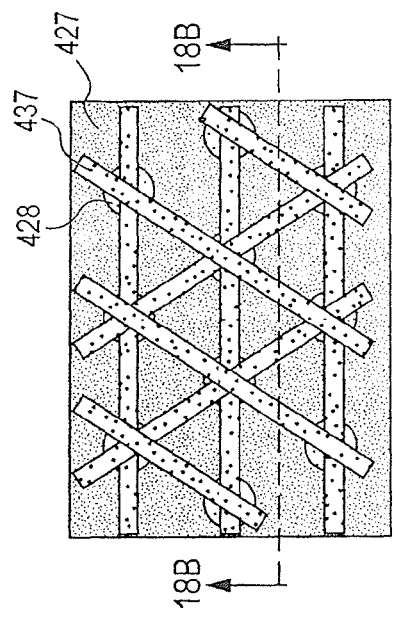
FIG. 18A illustrates a top view of the phase change memory array of FIG. 16 at a stage of fabrication subsequent to FIG. 17A.
Figure 18B:
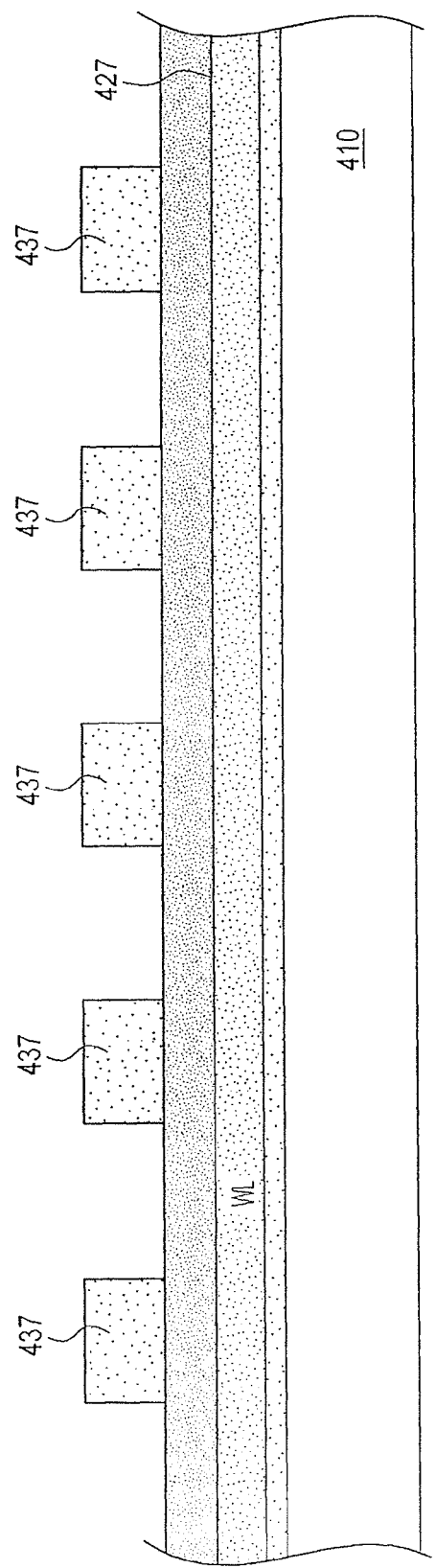
FIG. 18B illustrates a cross-section taken along line 18B-18B of the phase change memory array of FIG. 18A.

As shown in FIG. 18A, a resist pattern 437 is provided over the substrate 410, such that intersections are provided over the STI regions 428. FIG. 18B illustrates a cross-section taken across line 18B-18B in the expanded top view of 18A.

Figure 19A:
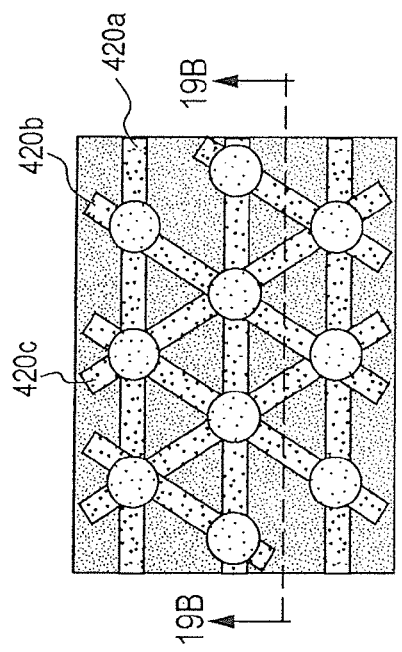
FIG. 19A illustrates a top view of the phase change memory array of FIG. 16 at a stage of fabrication subsequent to FIG. 18A.
Figure 19B:
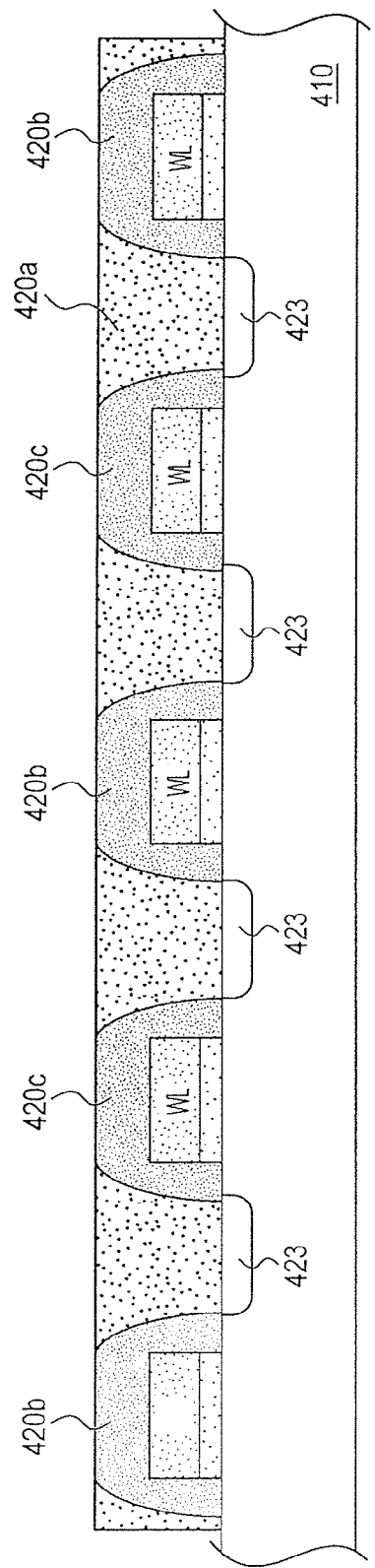
FIG. 19B illustrates a cross-section taken along line 19B-19B of the phase change memory array of FIG. 19A.

A photolithography and dry etch process is performed to produce gate stacks of word lines 420a, 420b, 420c that intersect over the STI regions 128, as shown in the expanded top view of FIG. 19A. The photolithography and dry etch process is used to etch isolated gate stacks of word lines 420a, 420b, 420c, stopping above the silicon substrate 410, as shown in the cross-section illustrated in FIG. 19B, taken across line 19B-19B of FIG. 19A. Nitride spacers are formed to complete the formation of the transistors and source/drain regions 423 are formed. A silicide metal (such as Co, Ni or Ti) is deposited for source/drain silicidation (or salicidation for polysilicon/TEOS gate stacks).

Because the gate stacks of word lines 420a, 420b, 420c are isolated, they must be electrically connected in order to form word lines. FIG. 20A illustrates an expanded top view of this connection and FIG. 20B is a cross-section taken along line 20B-20B of FIG. 20A. As shown in FIG. 20B, contacts 430a are formed to electrically connect the gate stacks of the first array of word lines 420*a* to a first array of horizontally-aligned straps 429*a*. Contacts 430*b* are formed to electrically connect the gate stacks of the second array of word lines 420*b* with a second array of straps 429*b*, which are positioned along the second array of word lines 420*b*. Contacts 430*c* are formed to electrically connect the gate stacks of the third array of word lines 420*c* to a third array of straps 429*c*, which are positioned along the third array of word lines 420*c*. All three arrays of straps 429*a*, 429*b*, 429*c* are typically conductive metal lines having a nitride encapsulating layer 431*a*, 431*b*, 431*c* provided over them to electrically isolate the straps 429*a*, 429*b*, 429*c*.

Figure 21A:
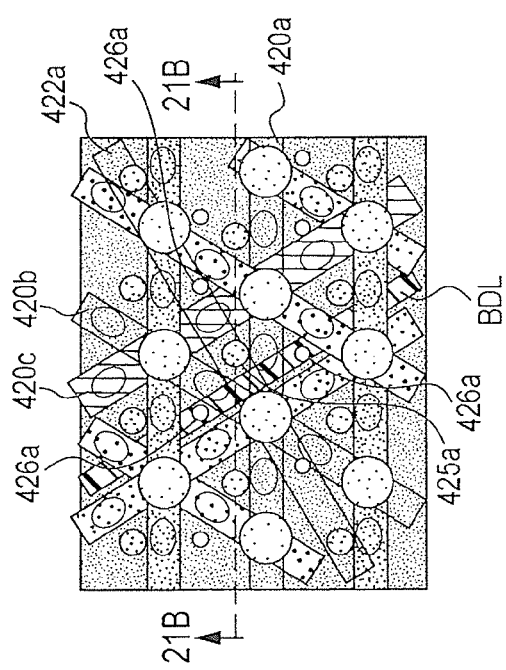
FIG. 21A illustrates a top view of the phase change memory array of FIG. 16 at a stage of fabrication subsequent to FIG. 20A.
Figure 21B:
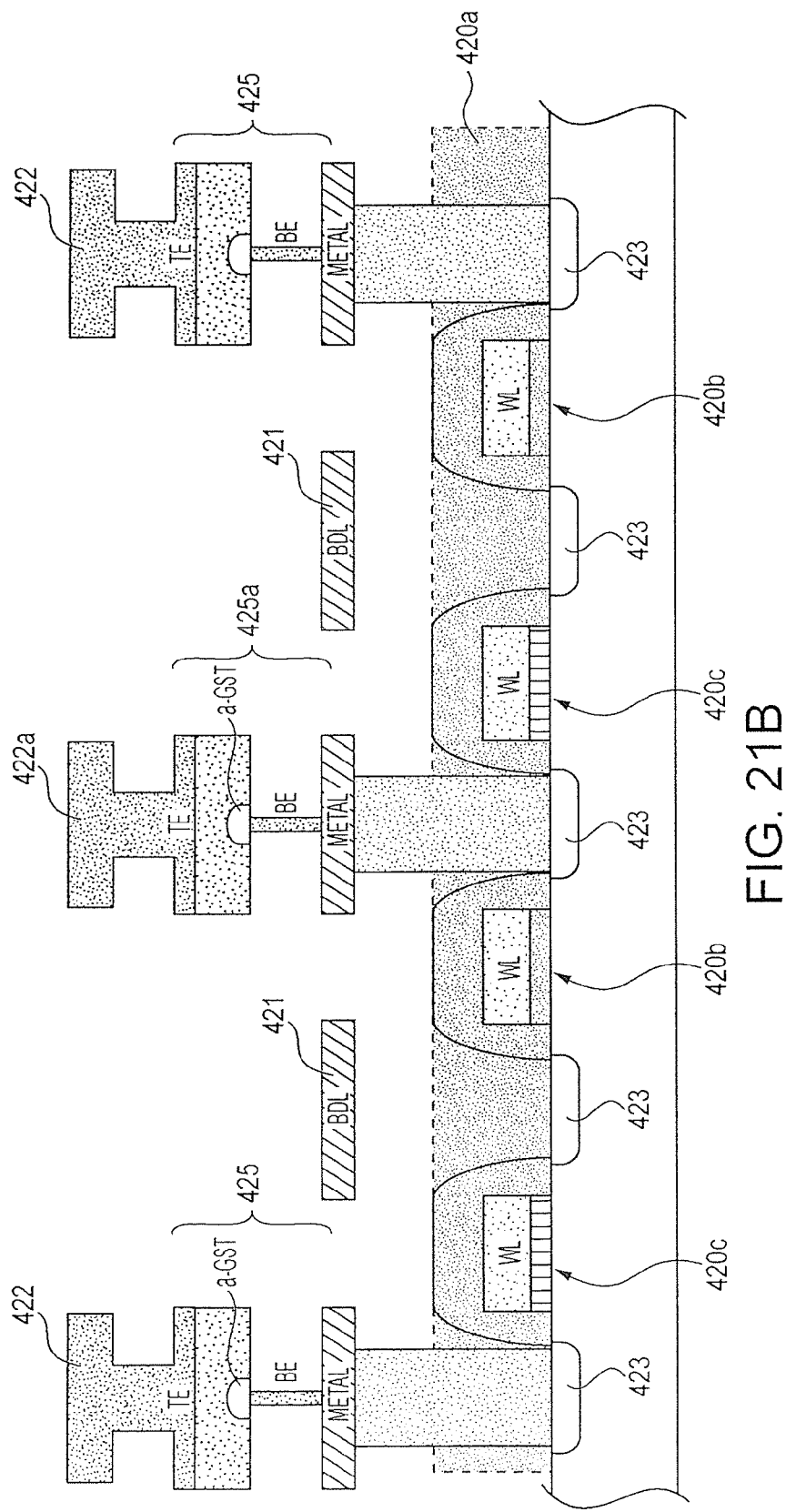
FIG. 21B illustrates a cross-section taken along line 2113-21B of the phase change memory array of FIG. 21A.

A plurality of top electrode select lines 422 are provided in contact with the top electrodes of the phase change memory elements 425, however, no two adjacent phase change memory elements 425 are connected to the same top electrode select lines 422, as shown in FIGS. 21A and 21B. It should be understood that, for simplicity of illustration, the transistors and straps connecting them are represented as word lines 420*a*, 420*b*, 420*c*.

The embodiment of FIG. 16 having word lines configured in a hexagonal lattice configuration may also be fabricated with one word line array using a recessed transistors, while the other two word line arrays are conventional transistors, or with all three word line arrays having conventional transistors, as described above. Another method of forming the embodiment of FIG. 16 may be the third method described above with respect to FIGS. 9A, 9B and 11A-12B, which employs photo-patterning and dry etch techniques to form the enclosing gate stacks.

Figure 22:
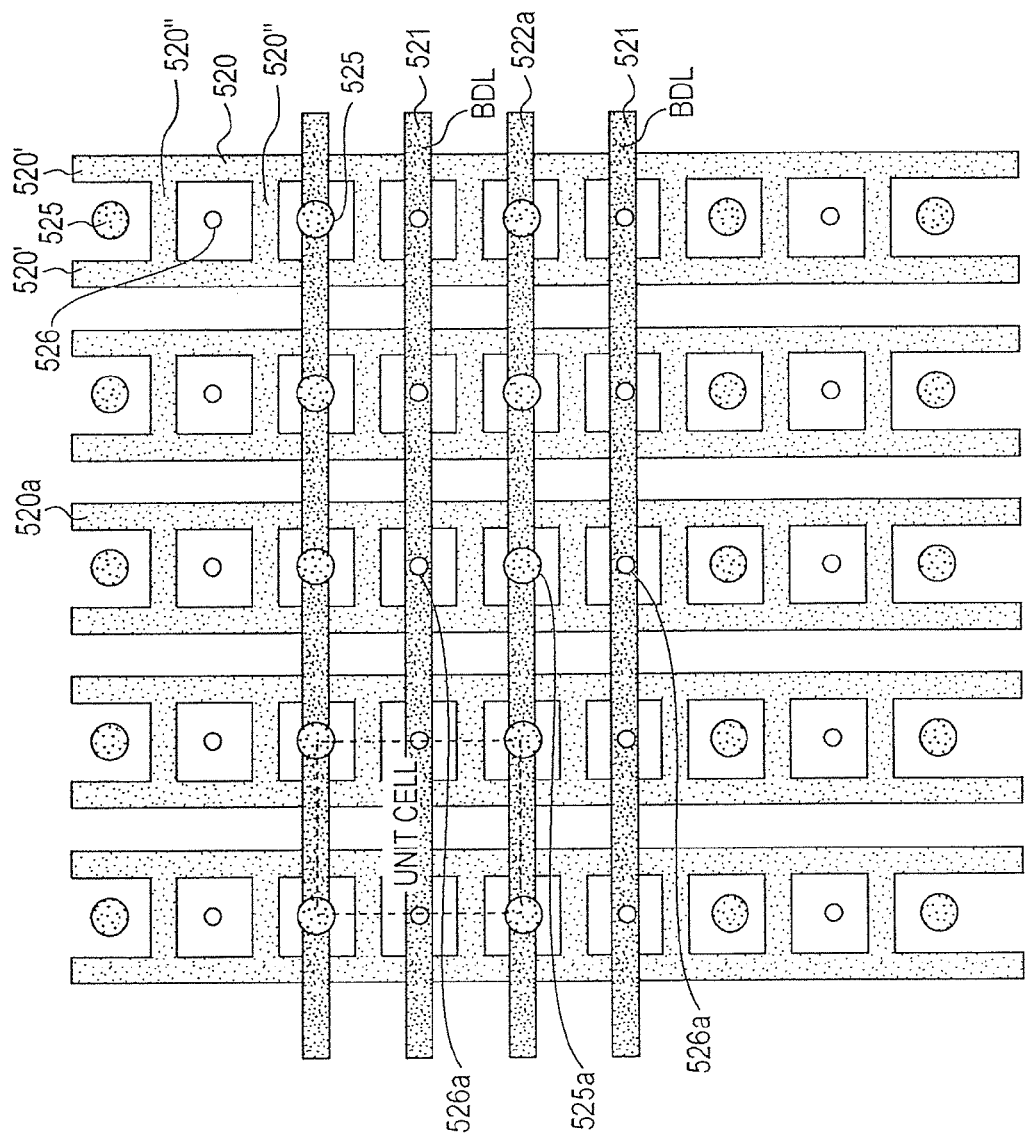
FIG. 22 illustrates a top view of a phase change memory array according to a fourth embodiment.

FIG. 22 illustrates a fourth embodiment in which the word lines 520 have a "ladder-shaped" configuration, consisting of two parallel segments 520' and shorter segments 520" connecting the two parallel segments 520'. The two parallel segments 520' run on either side of a column of alternating phase change memory elements 525 and bitline contacts 526, while the shorter segments 520" are positioned between the phase change memory elements 525 and the bitline contacts 526. The bitline contacts 526 may all be grounded or biased at the same voltage. For ease of illustration, not all bitlines are shown.

To program a selected phase change memory element 525*a*, the word line 520*a* enclosing the selected phase change memory element 525*a* is turned on. A top electrode select line 522*a* that is in contact with the selected phase change memory element 525*a* is also selected. For ease of illustration, not all top electrode select lines are shown. The four transistors of selected word line 520*a* enclosing the phase change memory element 525*a* are turned on to supply programming current to the element 525*a*. Current flows from the selected top electrode select line 522*a* through the phase change memory element 525*a* to the common source/drain region of the transistors of the word lines 522*a* and across the transistors to the common source/drain regions to the nearest bitline contacts 526*a*.

The embodiment of FIG. 22 having word lines configured in a "ladder" lattice configuration with four enclosing transistors around the phase change memory elements can provide to each phase change memory element a current that is at least four times greater than a conventional planar transistor. At the same time, this array optimizes the silicon area by taking advantage of the symmetry of the array to minimize the unit cell area by sharing transistor source/drain regions with adjacent transistors. In the embodiment of FIG. 22, the unit cell area is less than 14f$^2$.

Figure 23:
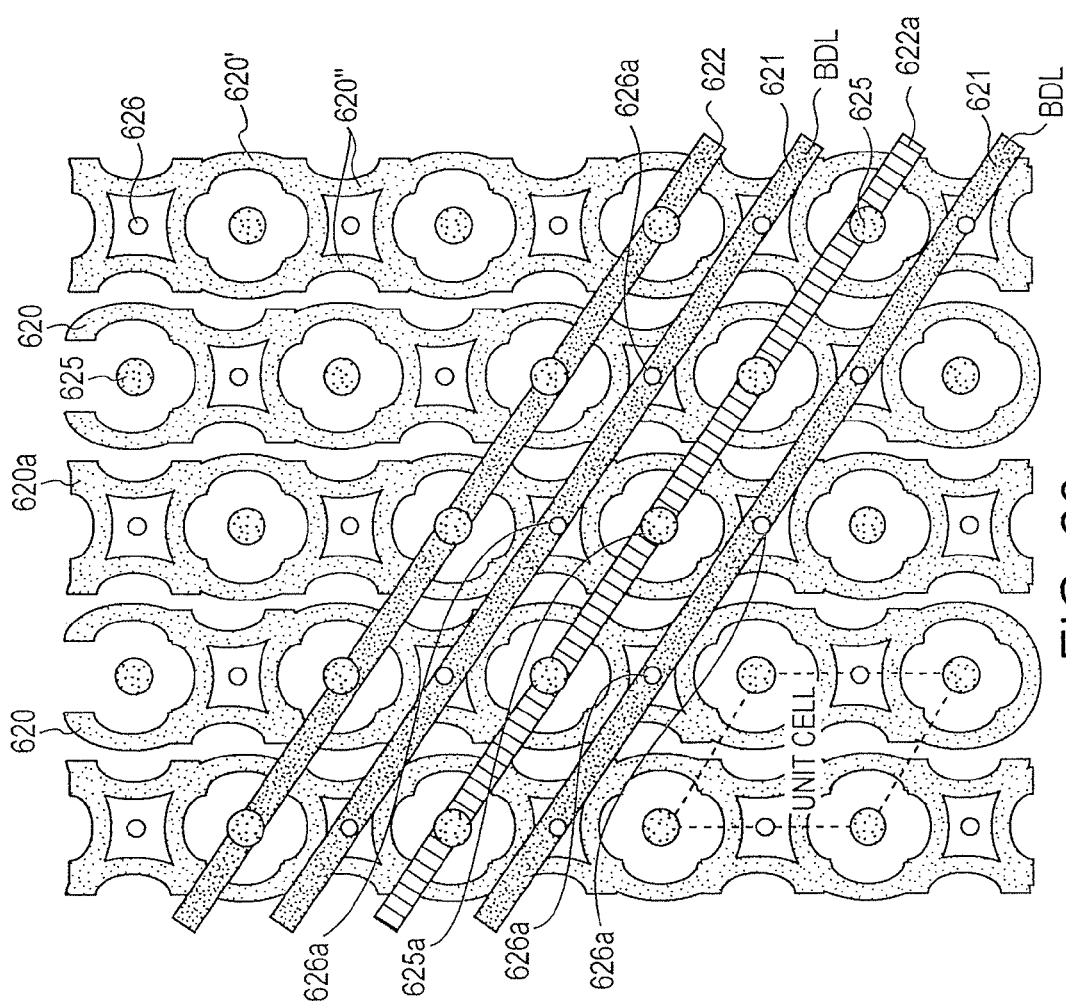
FIG. 23 illustrates a top view of a phase change memory array according to a fifth embodiment.

FIG. 23 illustrates a fifth embodiment in which the word lines 620 have a "rounded ladder-shaped" configuration, consisting of rings 620' enclosing the phase change memory elements 625 that are connected by segments 620" that enclose bitline contacts 626. The bitline contacts 626 and phase change memory elements 625 are alternately positioned in columns and rows, with at least a ring 620' and/or segment 620" between them. Because the word lines 620 are curved, the transistor effective width of the word lines 620 is increased when compared to a straight word line in the same configuration. The unit cell area is less than 14f$^2$.

Figure 24:
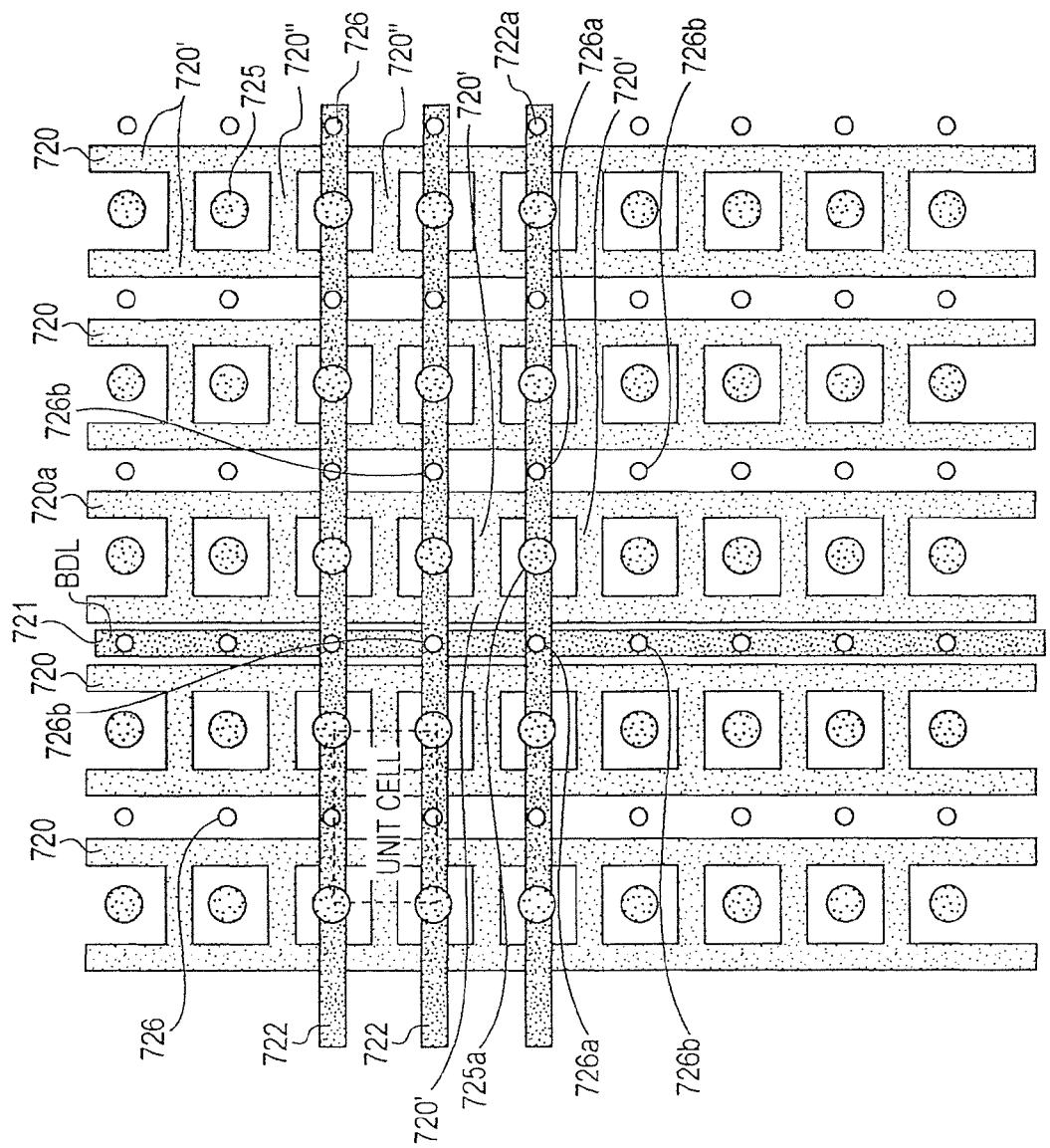
FIG. 24 illustrates a top view of a phase change memory array according to a sixth embodiment.

FIG. 24 illustrates a sixth embodiment in which the word lines 720 have a ladder-shaped configuration, consisting of two parallel segments 720' and rung segments 720" connecting the two parallel segments 720'. The two parallel segments 720' run on either side of a column of phase change memory elements 725, with the rung segments 720" being positioned between the phase change memory elements 725. Bitline contacts 726 are positioned within the rows of phase change memory elements 725, alternating with the phase change memory elements 725, and placed between the word lines 720. The bitline contacts 726 may all be grounded or biased at the same voltage. For ease of illustration, not all bitlines are shown.

To program a selected phase change memory element 725*a*, the word line 720*a* enclosing the selected phase change memory element 725*a* is turned on. A top electrode select line 722*a* that is in contact with the selected phase change memory element 725*a* is also selected. For ease of illustration, not all top electrode select lines are shown. The four transistors enclosing the phase change memory element 725*a* are turned on to supply programming current to the element 725*a*. Current flows from the selected top electrode select line 722*a* through the phase change memory element 725*a* across the transistors of the selected word lines 720*a* to the adjacent bitline contacts 726*a*. Current also flows through the transistors 720" to the common source/drain region of the transistors 720" and a neighboring transistor 720' to the adjacent bitline contacts 726*b*.

The embodiment of FIG. 24 having word lines configured in a ladder lattice configuration with four enclosing transistors around the phase change memory elements can provide to each phase change memory element a current that is at least three times greater than a conventional planar transistor. At the same time, this array optimizes the silicon area by taking advantage of the symmetry of the array to minimize the unit cell area by sharing transistor source/drain regions with adjacent transistors. In the embodiment of FIG. 24, the unit cell area is approximately 8f$^2$.

FIGS. 25A-27B illustrate a first method of forming the phase change memory array of FIG. 24. FIG. 25A is an expanded top view of the memory array at an initial stage of fabrication. FIG. 25B is a cross-section of FIG. 25A, taken across line 25B-25B. An ion implantation process may be performed to define a desired dopant profile in the silicon substrate 710. An array ladder-like word lines 720 are patterned on a silicon substrate 710 by photolithography and dry etch processes.

Figure 26A:
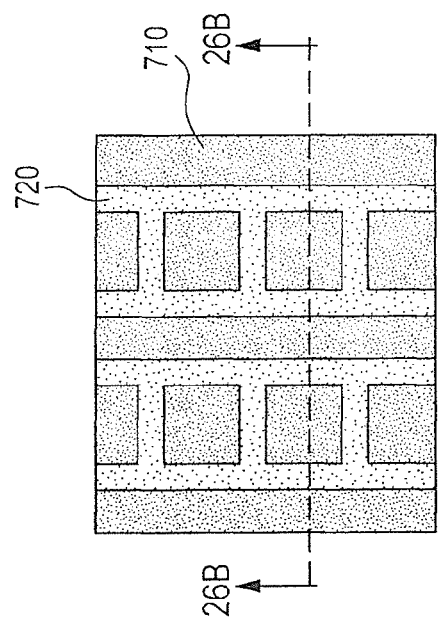
FIG. 26A illustrates an expanded top view of the phase change memory array of FIG. 24 at a stage of fabrication subsequent to FIG. 25A.
Figure 26B:
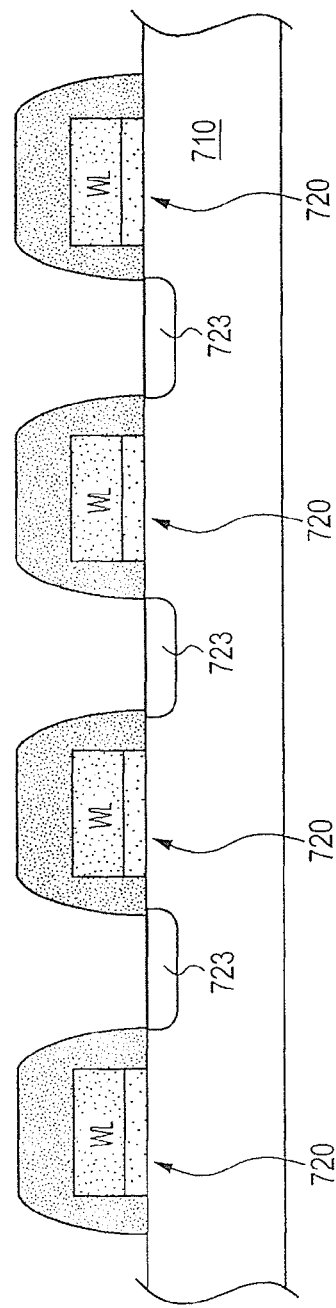
FIG. 26B illustrates a cross-section taken along line 26B-26B of the phase change memory array of FIG. 26A.

Turning now to FIGS. 26A and 26B, nitride spacers may be formed on the word lines 720 before source/drain regions 723 are formed by one or more high-dose implants. A silicide metal such as Co, Ni, or Ti is deposited for silicidation (or salicidation if the gate stacks of the word lines are polysilicon/TEOS gate stacks) of the source/drain regions 723.

Figure 27A:
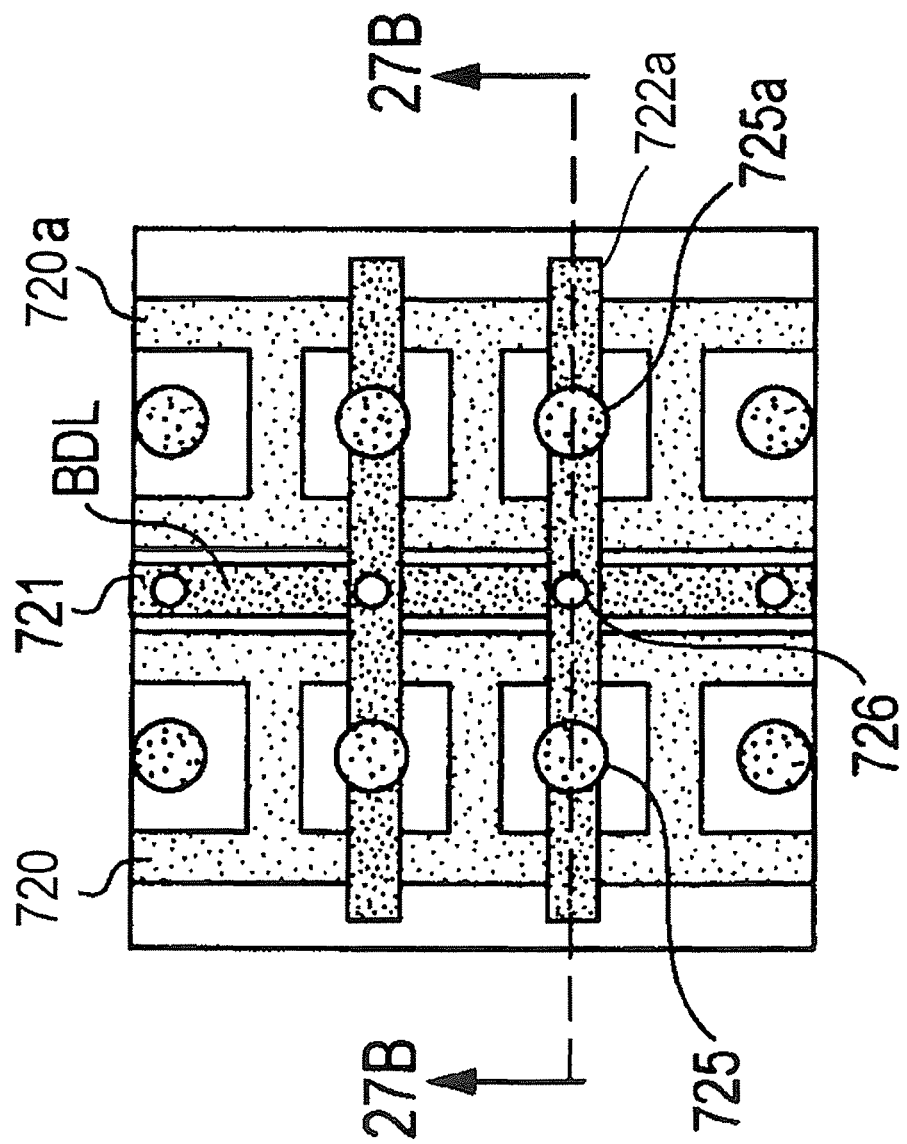
FIG. 27A illustrates an expanded top view of the phase change memory array of FIG. 24 at a stage of fabrication subsequent to FIG. 26A.
Figure 27B:
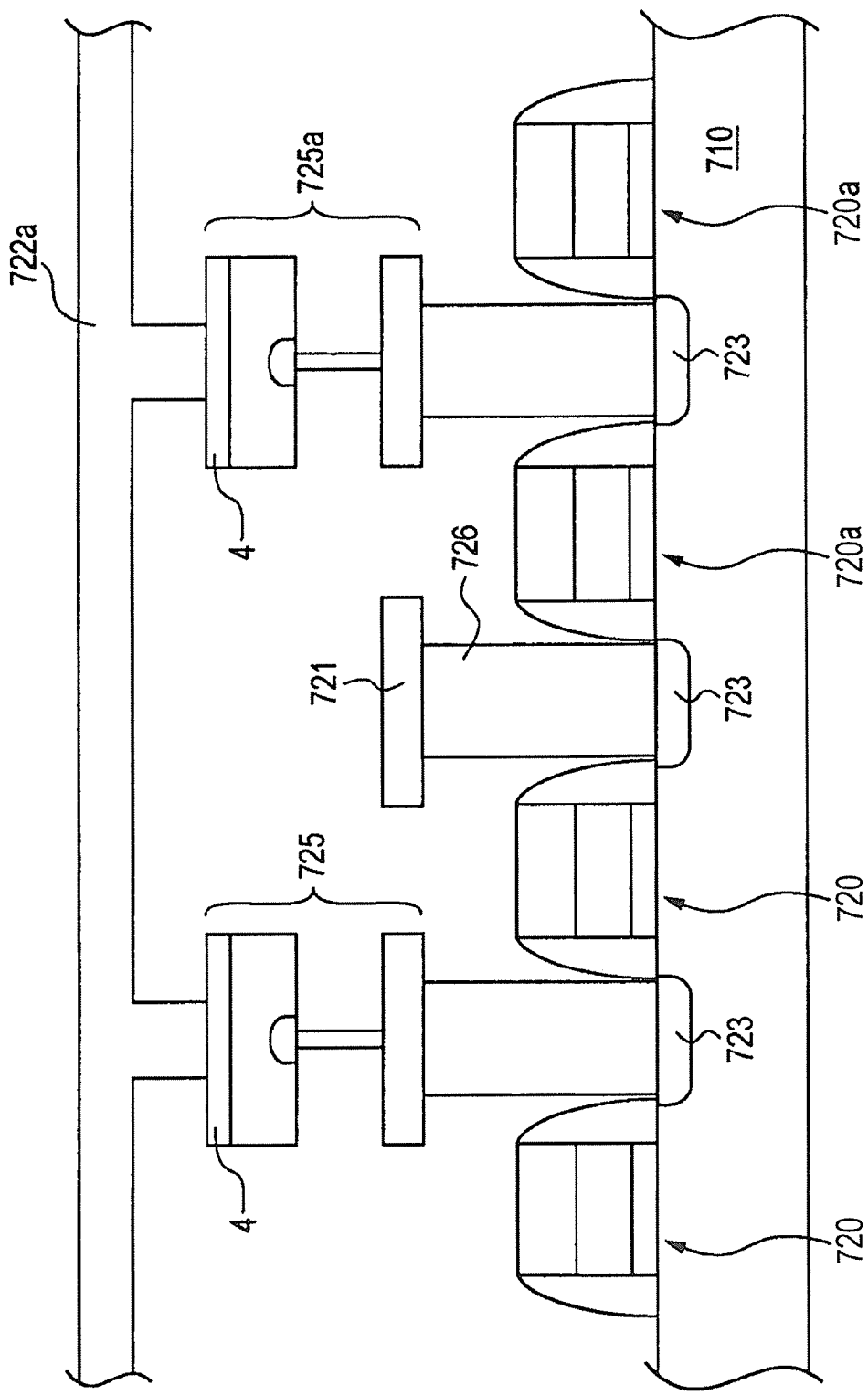
FIG. 27B illustrates a cross-section taken along line 27A-27A of the phase change memory array of FIG. 27A.

Self-aligned metal contacts and bitline contacts 726 are formed over the source/drain regions 723, as shown in FIGS. 27A and 27B. Material for bitlines 721 are deposited and patterned. The phase change memory elements 725 are formed in layers, as shown in FIGS. 1A and 1B, and the top electrode select lines 722a are formed with a contact to the top electrode 4 of the phase change memory elements 725.

Figure 28:
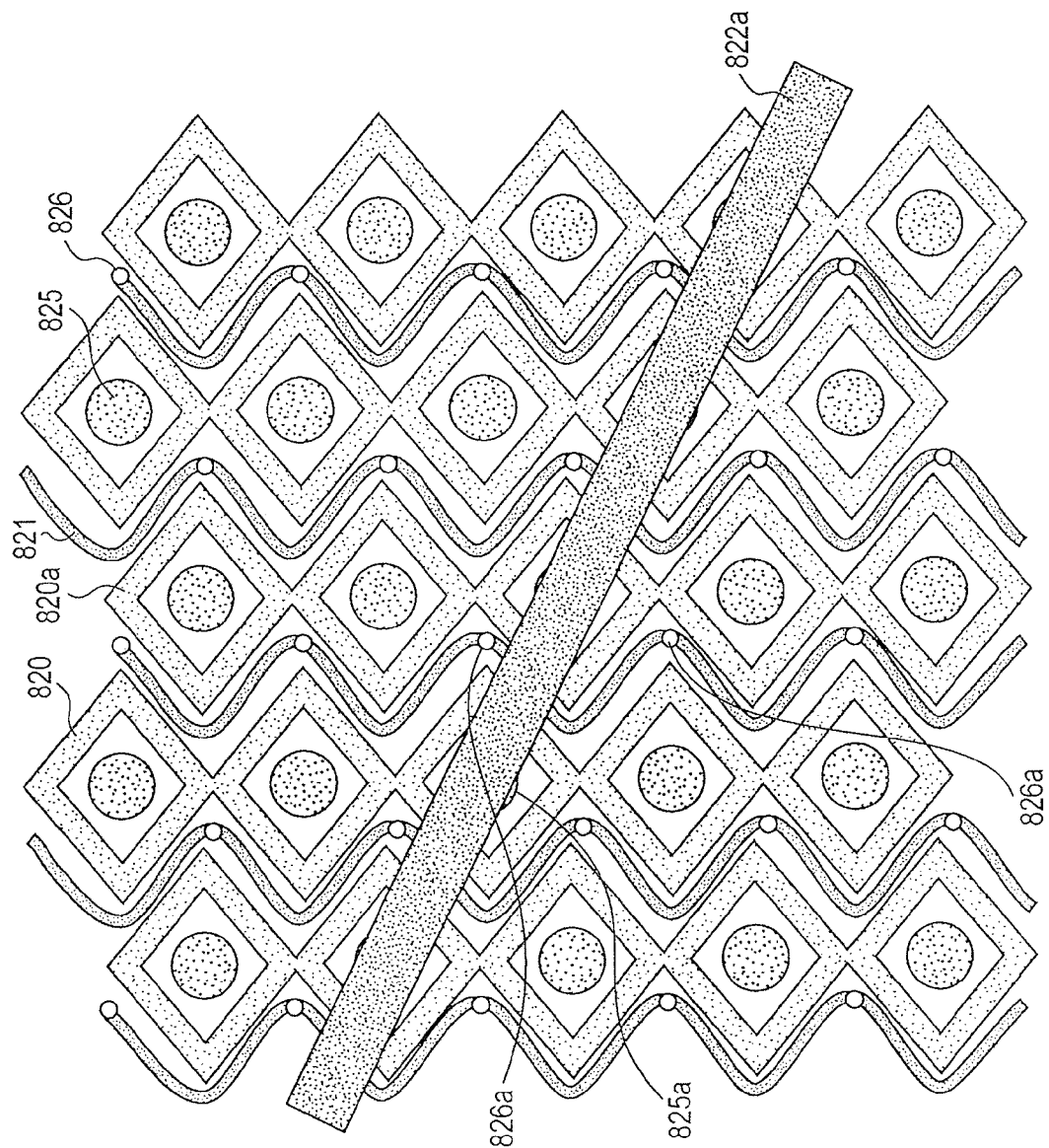
FIG. 28 illustrates a top view of a phase change memory array according to a seventh embodiment.

FIG. 28 illustrates a seventh embodiment in which the word lines 820 have a "diamond" lattice configuration, enclosing the phase change memory elements 825 with four transistors in a diamond-shaped configuration. Bitline contacts 826 are positioned between columns of diamond-shaped word lines 820. More or fewer bitline contacts 826 may be provided than are shown. The bitline contacts 826 may all be grounded or biased at the same voltage.

To program a selected phase change memory element 825a, the word line 820a enclosing the selected phase change memory element 825a is turned on. A top electrode select line 822a that is in contact with the selected phase change memory element 825a is also selected. For ease of illustration, not all top electrode select lines are shown. The four transistors enclosing the phase change memory element 825a are turned on to supply programming current to the element 825a. Current flows from the selected top electrode select line 822a through the phase change memory element 825a into the common source/drain regions surrounding the enclosing transistors to the adjacent bitline contacts 826a.

The embodiment of FIG. 28 having word lines configured in a diamond lattice configuration with four enclosing transistors around the phase change memory elements can provide to each phase change memory element a current that is at least four times greater than a conventional planar transistor. At the same time, this array optimizes the silicon area by taking advantage of the symmetry of the array to minimize the unit cell area by sharing transistor source/drain regions with adjacent transistors. In the embodiment of FIG. 28, the unit cell area is less than $9.5f^2$.

Figure 29:
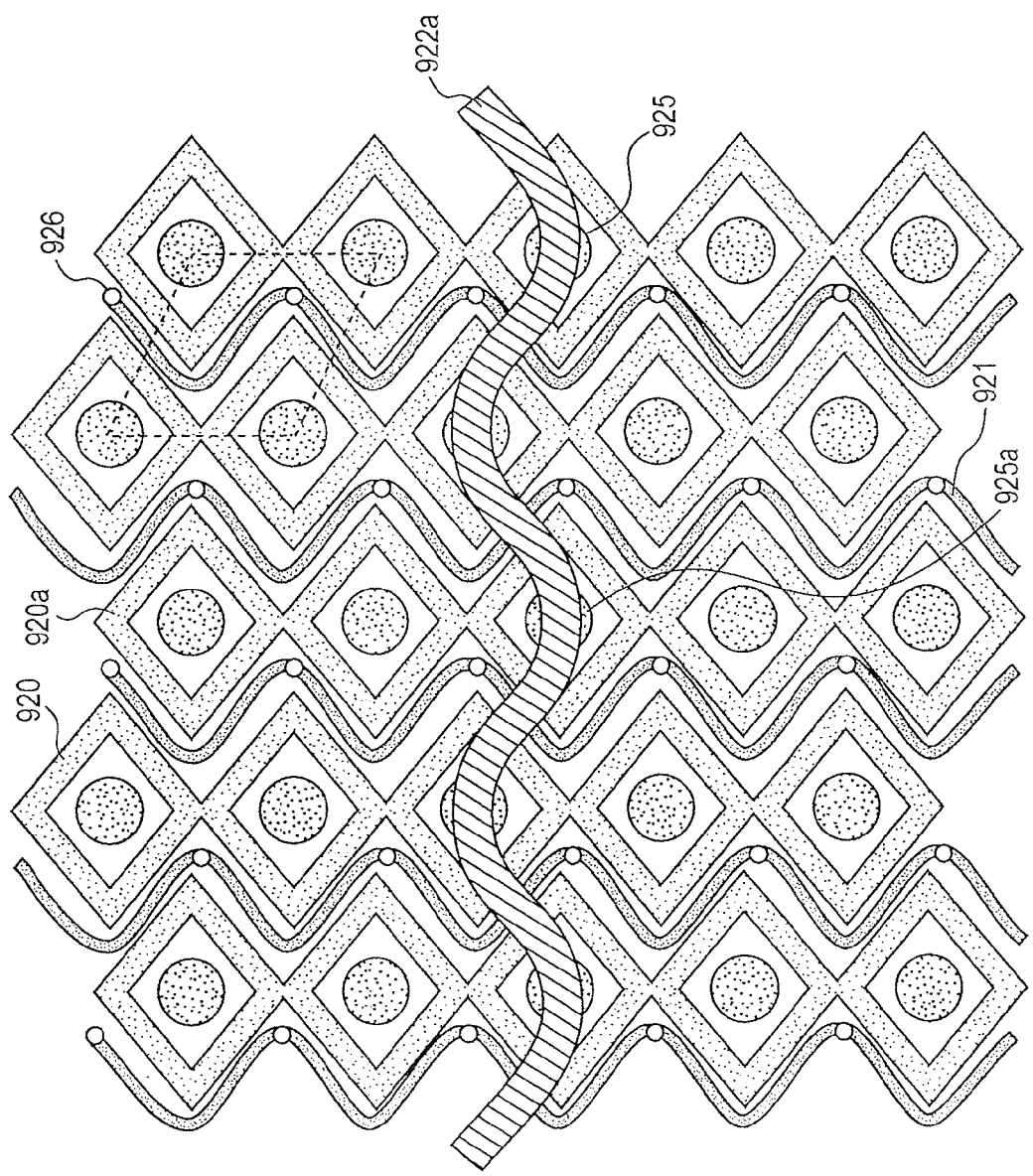
FIG. 29 illustrates a top view of a phase change memory array according to an eighth embodiment.

FIG. 29 illustrates an eighth embodiment, which is a variation on FIG. 28 having a phase change memory array with word lines 920a in a diamond lattice configuration. However, top electrode select line 922a is wavy, and runs in a perpendicular line across the plurality of word lines 920 and phase change memory elements 925, 925a.

Figure 30A:
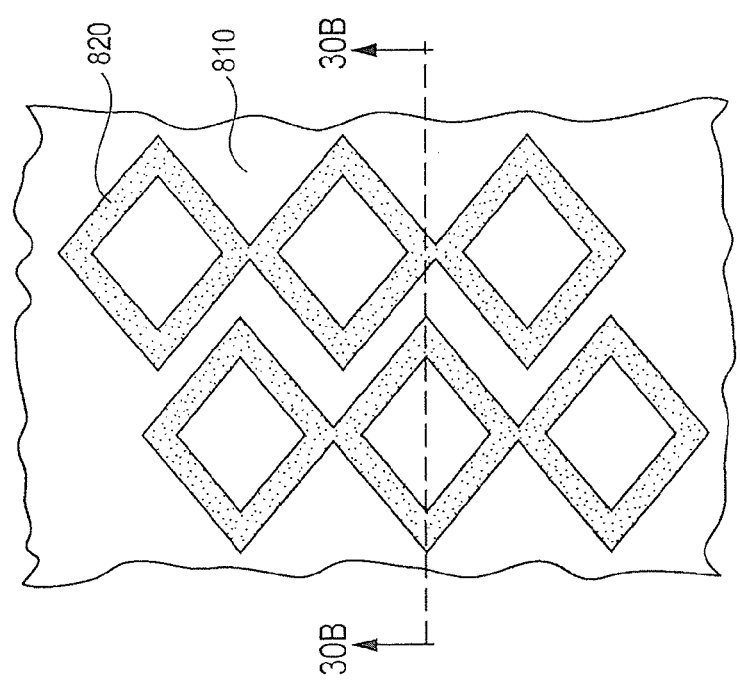
FIG. 30A illustrates an expanded top view of the phase change memory array of FIG. 28 at an initial stage of fabrication.
Figure 30B:
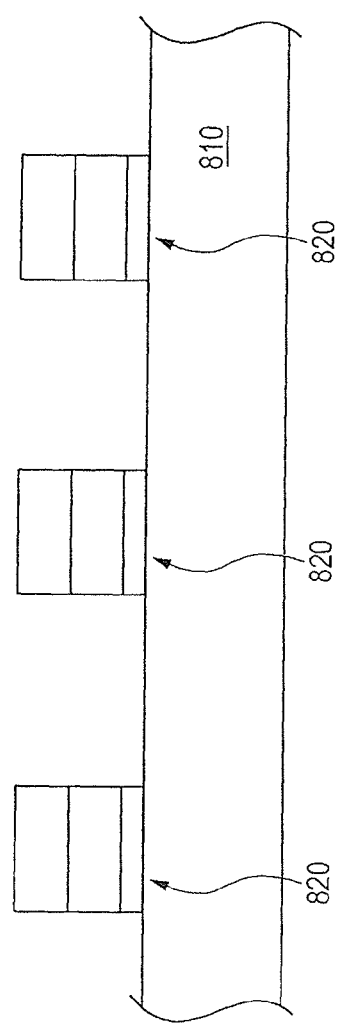
FIG. 30B illustrates a cross-section taken along line 30B-30B of the phase change memory array of FIG. 30A.

FIGS. 30A-32 illustrate a method of forming the phase change memory array of FIG. 28 FIG. 30A is an expanded top view of the memory array at an initial stage of fabrication. FIG. 30B is a cross-section of FIG. 30A, taken across line 30B-30B. An ion implantation process may be performed to define a desired dopant profile in the silicon substrate 810. An array of diamond-like word lines 820 are patterned on a silicon substrate 810 by photolithography and dry etch processes.

Figure 31:
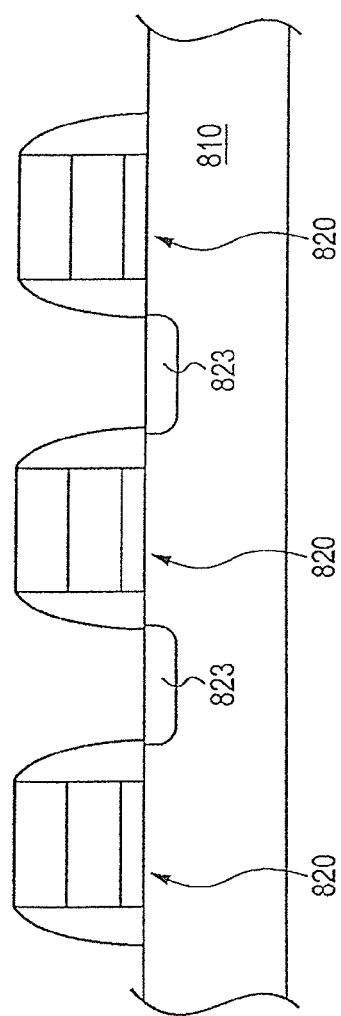
FIG. 31 illustrates a cross-section of the phase change memory array of FIG. 28 at a stage of fabrication subsequent to FIG. 30A.

Turning now to FIG. 31, nitride spacers may be formed on the word lines 820 before source/drain regions 823 are formed by one or more high-dose implants. A silicide metal such as Co, Ni, or Ti is deposited for silicidation (or salicidation if the gate stacks of the word lines are polysilicon/TEOS gate stacks) of the source/drain regions 823.

Figure 32:
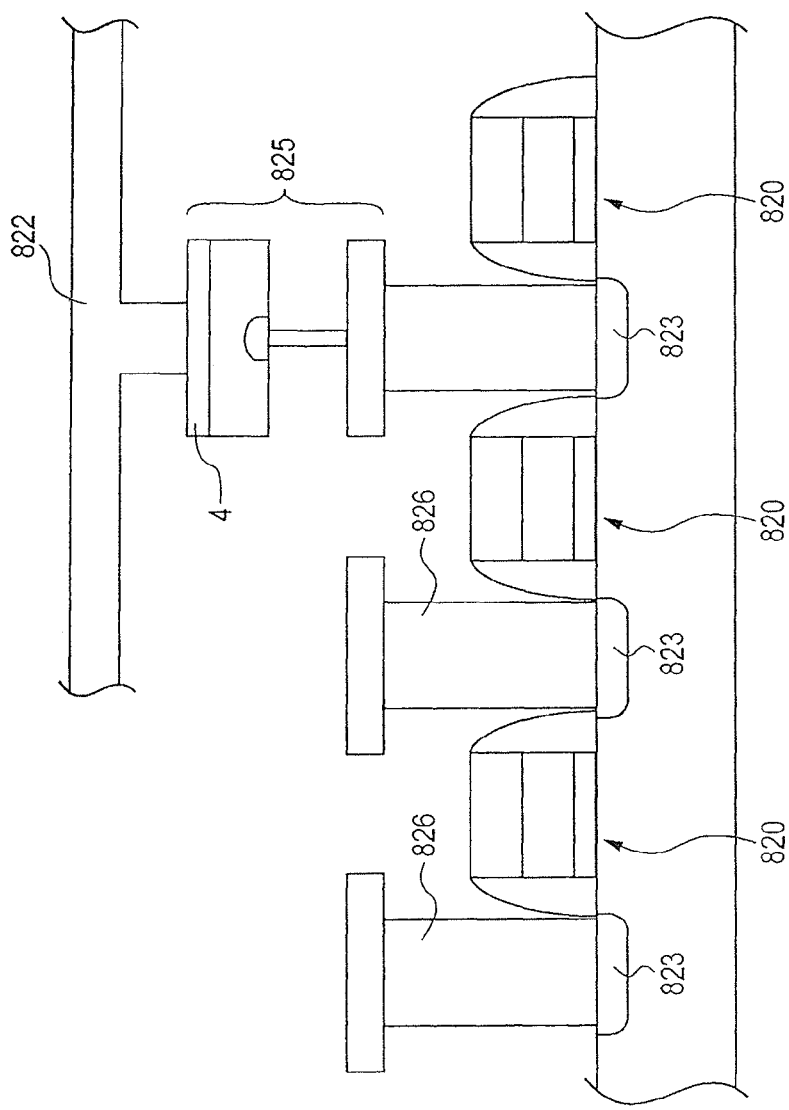
FIG. 32 illustrates a cross-section of the phase change memory array of FIG. 28 at a stage of fabrication subsequent to FIG. 31.

Self-aligned metal contacts and bitline contacts 826 are formed over the source/drain regions 823, as shown in FIG. 32. Material for bitlines 821 are deposited and patterned. The phase change memory element 825 is formed in layers, as shown in FIGS. 1A and 1B, and the top electrode select line 822 is formed with a contact to the top electrode 4 of the phase change memory elements 825. A similar method may be employed to form the phase change memory array of FIG. 29.

Figure 33:
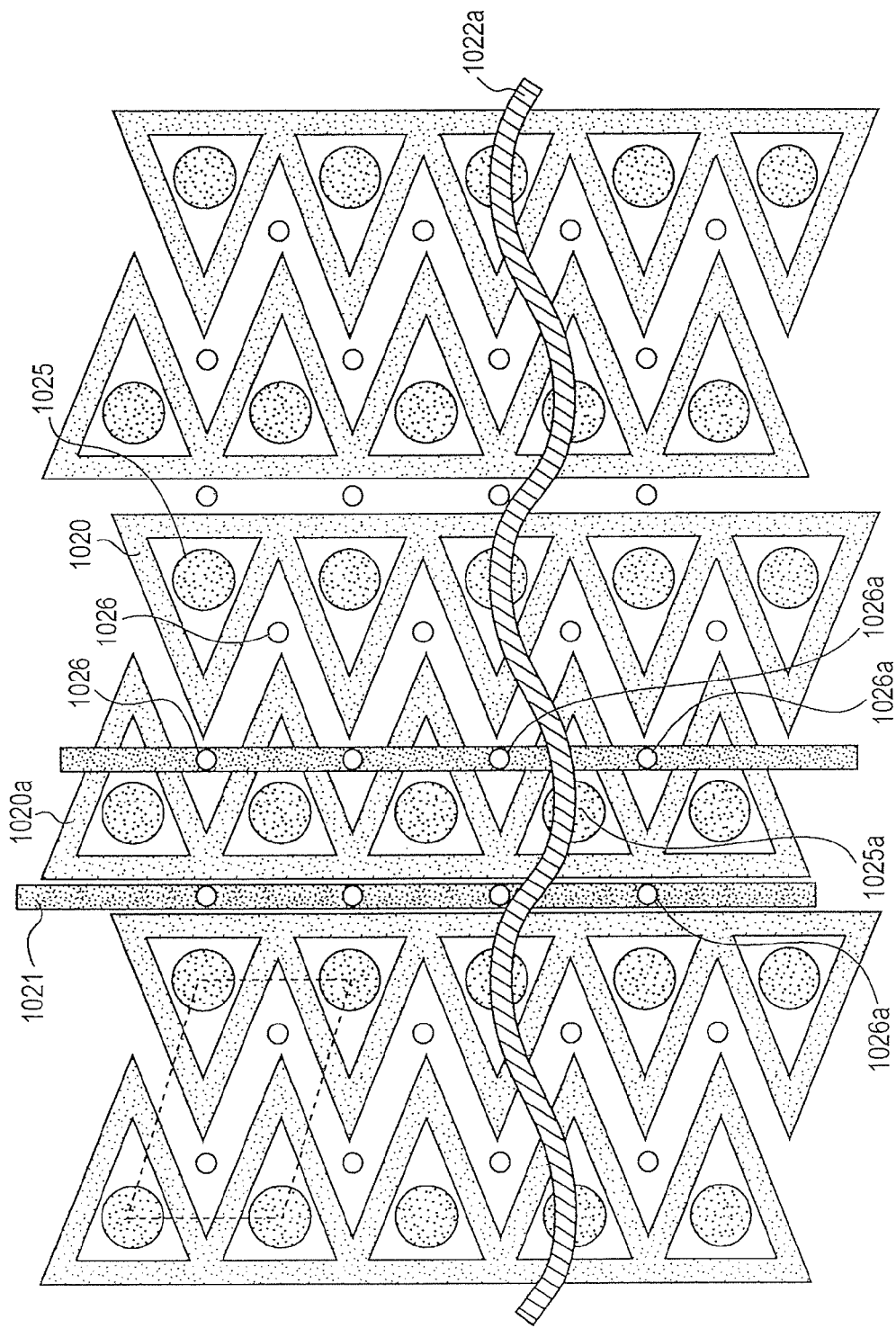
FIG. 33 illustrates a top view of a phase change memory array according to a ninth embodiment.

FIG. 33 illustrates a ninth embodiment in which the word lines 1020 have a "triangular" lattice configuration, enclosing the phase change memory elements 1025 with three transistors in a triangle configuration. Bitline contacts 1026 may be positioned near the apex of the triangle-shaped word lines 1020 or other locations outside of the three enclosing transistors. The bitline contacts 1026 may all be grounded or biased at the same voltage.

To program a selected phase change memory element 1025a, the word line 1020a enclosing the selected phase change memory element 1025a is turned on. A top electrode select line 1022a that is in contact with the selected phase change memory element 1025a is also selected. For ease of illustration, not all top electrode select lines are shown. The three transistors enclosing the phase change memory element 1025a are turned on to supply programming current to the element 1025a. Current flows from the selected top electrode select line 1022a through the phase change memory element 1025a across the transistors of the enclosing word lines 1020 and into the common source/drain regions to the adjacent bitline contacts 1026a.

The embodiment of FIG. 33 having word lines 1020 configured in a triangular lattice configuration with three enclosing transistors around the phase change memory elements can provide to each phase change memory element a current that is about five times greater than a conventional planar transistor. At the same time, this array optimizes the silicon area by taking advantage of the symmetry of the array to minimize the unit cell area by sharing transistor source/drain regions with adjacent transistors. In the embodiment of FIG. 33, the unit cell area is less than $16f^2$.

Figure 34:
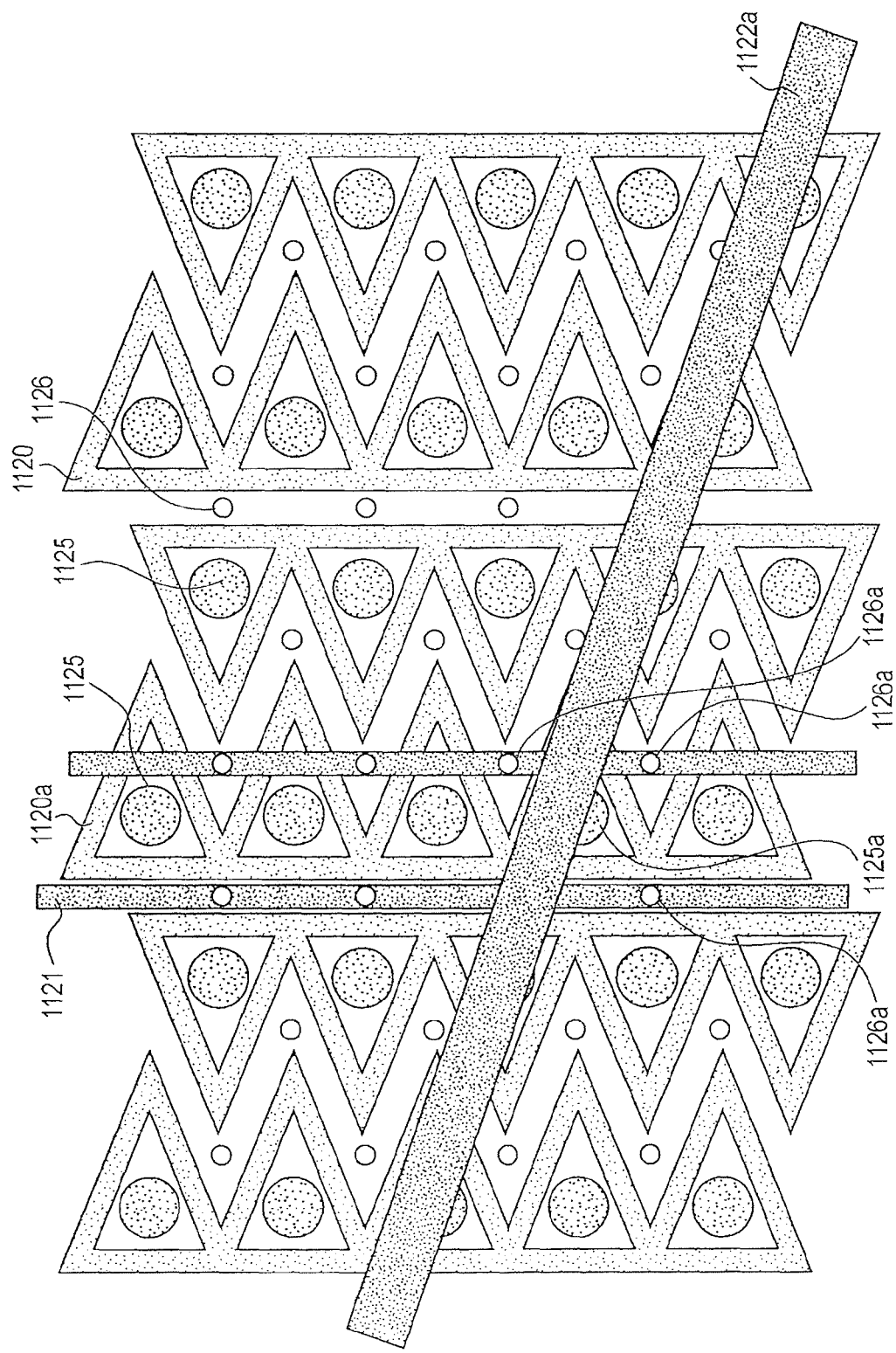
FIG. 34 illustrates a top view of a phase change memory array according to a tenth embodiment.

FIG. 34 illustrates a tenth embodiment which is a variation on FIG. 33 having a phase change memory array with word lines 1120a in a triangular lattice configuration. However, top electrode select line 1122a is straight, and runs in an angle across the plurality of word lines 1120 and phase change memory elements 1125, 1125a.

FIG. 35 illustrates a simplified processor system 100 which includes a memory circuit 106 having a phase change memory array constructed in accordance with the invention.

The FIG. 35 processor system 100, which can be any system including one or more processors, for example, a computer, PDA, phone or other control system, generally comprises a central processing unit (CPU) 102, such as a microprocessor, a digital signal processor, or other programmable digital logic devices, which communicates with an input/output (I/)) device 105 over a bus 101. The memory circuit 106 communicates with the CPU 102 over buss 101 typically through a memory controller. The memory circuit 106 includes one or more of the phase change memory arrays depicted in FIGS. 2, 14, 16, 22-24, 28, 29, 33 and/or 34.

In the case of a computer system, the processor system 100 may include peripheral devices such as a compact disc (CD) ROM drive 103 and hard drive 104, which also communicate with CPU 102 over the bus 101. If desired, the memory circuit 106 may be combined with the processor, for example, CPU 102, in a single integrated circuit.

While various embodiments have been described herein as relating to a phase change memory arrays, it should be appreciated that the lattice arrays and transistor arrangements described herein may be used with other variable resistance memory technologies and other technologies that require high programming current. Examples of such memory technologies include MRAM, RRAM, STT (Spin-Torque-Transfer), and the like.

The above description and drawings are only to be considered illustrative of specific embodiments, which achieve the features and advantages described herein. Modification and substitutions to specific process conditions and structures can be made. Accordingly, the embodiments of The invention are not to be considered as being limited by the foregoing description and drawings, but is only limited by the scope of the appended claims.

The invention claimed is:

1. An apparatus, comprising:
   a first word line extending along a first direction of an array, wherein the first word line comprises a repeating pattern of a first set of enclosures;
   a first set of memory elements, each memory element of the first set of memory elements formed on and coupled with a respective contact that is enclosed by a respective enclosure of the first set of enclosures;
   a bitline extending along the first direction and disposed adjacent to the first word line; and
   a first select line extending along a second direction perpendicular to the first direction, the first select line electrically connected with a first memory element of the first set of memory elements, a second memory element of a second set of memory elements, and a third memory element of a third set of memory elements such that the first select line has a wavy pattern, wherein the second memory element is diagonally adjacent to the first memory element and the third memory element.

2. The apparatus of claim 1, further comprising:
   a second word line extending along the first direction of the array, wherein the second word line comprises a repeating pattern of a second set of enclosures, each memory element of the second set of memory elements formed on and coupled with a respective contact that is enclosed by a respective enclosure of the second set of enclosures.

3. The apparatus of claim 2, wherein the repeating pattern of the first set of enclosures and the repeating pattern of the second set of enclosures each form a diamond lattice pattern.

4. The apparatus of claim 3, wherein the first word line is offset from the second word line along the first direction such that peaks of the diamond lattice pattern of the first word line are at least partially disposed within valleys of the diamond lattice pattern of the second word line.

5. The apparatus of claim 2, wherein the bitline curves between the first word line and the second word line.

6. The apparatus of claim 1, wherein the first memory element is formed on and coupled with a first respective contact, and wherein an enclosure of the first set of enclosures forms a structure around the first respective contact, the structure comprising three or more transistors adjacent to the first respective contact.

7. The apparatus of claim 1, wherein the repeating pattern of the first set of enclosures forms a diamond lattice pattern, and wherein the bitline comprises a pattern of bitline contacts, wherein each bitline contact of the pattern of bitline contacts is located at a respective peak of the diamond lattice pattern.

8. The apparatus of claim 6, wherein the structure is a diamond structure comprising four transistors.

9. The apparatus of claim 6, wherein the structure is a triangular structure comprising three transistors.

10. An apparatus, comprising:
    a memory array, comprising:
       a first memory element, a second memory element, and a third memory element, wherein the second memory element is diagonally adjacent to the first memory element and the third memory element;
       a word line extending along a first direction of the memory array, the word line comprising a repeating pattern of a set of enclosures, wherein the first memory element is formed on and coupled with a first contact that is enclosed by an enclosure of the set of enclosures;
       a bitline extending along the first direction and disposed adjacent to the word line; and
       a select line extending along a second direction perpendicular to the first direction, the select line electrically connected with the first memory element, the second memory element, and the third memory element such that the select line has a wavy pattern.

11. The apparatus of claim 10, further comprising a set of memory elements respectively formed on and coupled with a set of contacts, wherein the set of memory elements includes the first memory element and the set of contacts includes the first contact, wherein each contact of the set of contacts is respectively enclosed by an enclosure of the set of enclosures.

12. The apparatus of claim 10, wherein an enclosure of the set of enclosures forms a structure around the first contact, the structure comprising three or more transistors adjacent to the first contact.

13. The apparatus of claim 12, wherein the structure is a diamond structure comprising four transistors.

14. The apparatus of claim 12, wherein the structure is a triangular structure comprising three transistors.

15. The apparatus of claim 10, further comprising a second word line extending along the first direction, the second word line comprising a repeating pattern of a second set of enclosures, wherein the second memory element is formed on and coupled with a second contact that is enclosed by a second enclosure of the second set of enclosures.

16. The apparatus of claim 15, wherein the repeating pattern of the set of enclosures and the repeating pattern of the second set of enclosures each form a diamond lattice pattern.

17. The apparatus of claim 15, wherein the repeating pattern of the set of enclosures and the repeating pattern of the second set of enclosures each form a triangular lattice pattern.

18. The apparatus of claim 15, further comprising:
    a first set of memory elements respectively formed on and coupled with a first set of contacts, wherein the first set of memory elements includes the first memory element and the first set of contacts includes the first contact, wherein each contact of the first set of contacts is respectively enclosed by an enclosure of the set of enclosures; and
    a second set of memory elements respectively formed on and coupled with a second set of contacts, wherein the second set of memory elements includes the second memory element and the second set of contacts includes the second contact, wherein each contact of the second set of contacts is respectively enclosed by an enclosure of the second set of enclosures.

19. The apparatus of claim 15, further comprising a third word line extending along the first direction, the third word line comprising a repeating pattern of a third set of enclosures, wherein the third memory element is formed on and coupled with a third contact that is enclosed by a third enclosure of the third set of enclosures.

* * * * *